United States Patent
Koshiba et al.

(10) Patent No.: US 12,105,392 B2
(45) Date of Patent: Oct. 1, 2024

(54) DISPLAY DEVICE

(71) Applicant: Sharp Display Technology Corporation, Kameyama (JP)

(72) Inventors: Takahiro Koshiba, Kameyama (JP); Hiroto Akiyama, Kameyama (JP)

(73) Assignee: Sharp Display Technology Corporation, Kameyama (JP)

(*) Notice: Subject to any disclaimer, the term of this patent is extended or adjusted under 35 U.S.C. 154(b) by 0 days.

(21) Appl. No.: 18/386,111

(22) Filed: Nov. 1, 2023

(65) Prior Publication Data
US 2024/0192561 A1 Jun. 13, 2024

(30) Foreign Application Priority Data
Dec. 8, 2022 (JP) ................................. 2022-196426

(51) Int. Cl.
| | | |
|---|---|---|
| G09G 3/36 | (2006.01) | |
| G02F 1/1362 | (2006.01) | |
| G02F 1/1368 | (2006.01) | |
| H01L 27/12 | (2006.01) | |

(52) U.S. Cl.
CPC ...... *G02F 1/1368* (2013.01); *G02F 1/136286* (2013.01); *H01L 27/124* (2013.01)

(58) Field of Classification Search
CPC ............ G02F 1/1368; G02F 1/136286; G02F 1/13629; G02F 1/136272; H01L 27/124; H01L 2224/0612; H01L 2224/06138; H01L 2224/06139; H01L 2224/06148; H01L 2224/06149; H01L 2224/06158; H01L 2224/06159; H01L 2224/06168; H01L 2224/06169

See application file for complete search history.

(56) References Cited

U.S. PATENT DOCUMENTS

| | | | | |
|---|---|---|---|---|
| 2009/0167654 A1* | 7/2009 | Kim | ....................... | G02F 1/1345 345/87 |
| 2011/0006780 A1* | 1/2011 | Tanimoto | ............... | G02F 1/1345 345/55 |
| 2011/0050551 A1* | 3/2011 | Ota | ....................... | G09G 3/3648 345/87 |
| 2012/0169694 A1* | 7/2012 | Chuang | ................ | G09G 3/3655 349/38 |

(Continued)

FOREIGN PATENT DOCUMENTS

JP 2005-338191 A 12/2005

*Primary Examiner* — Hoan C Nguyen
(74) *Attorney, Agent, or Firm* — ScienBiziP, P.C.

(57) ABSTRACT

A display device includes a first pixel electrode, a first switching element, a first wiring, a second pixel electrode, a second switching element, a second wiring, a third wiring, a fourth wiring, a first insulating film, a second insulating film, and an alignment film, in which the first wiring includes a first lead-out portion disposed outside the display region and located on a lower layer side of the first insulating film, the second wiring includes a second lead-out portion disposed adjacent to the first lead-out portion outside the display region and located on a lower layer side of the second insulating film, the third wiring is located on the lower layer side of the first insulating film, and the fourth wiring is located on the lower layer side of the second insulating film on the upper layer side of the first insulating film.

8 Claims, 13 Drawing Sheets

(56) References Cited

U.S. PATENT DOCUMENTS

2014/0225818 A1\* 8/2014 Kim .................... G09G 3/3611
  345/87
2015/0206470 A1\* 7/2015 Wu ................... G02F 1/136286
  345/103

\* cited by examiner

DISPLAY DEVICE

CROSS-REFERENCE TO RELATED APPLICATION

The present application claims priority from Japanese Application JP2022-196426, the content of which is hereby incorporated by reference into this application.

BACKGROUND

1. Field

A technique disclosed in the present specification relates to a display device.

2. Description of the Related Art

In the related art, as an example of a display device, a liquid crystal display device described in Japanese Unexamined Patent Application Publication No. 2005-338191 below is known. The liquid crystal display device described in Japanese Unexamined Patent Application Publication No. 2005-338191 is provided with a device substrate configured such that a wiring interval of a wiring group on a substantially parallel line is bent and changed in the middle. The device substrate has a configuration in which a dummy wiring is disposed at a position corresponding to a substantial extension line of a wiring group having a narrow interval in a gap of a wiring group having a wide interval, or a configuration in which an interlayer film between an upper layer and the substrate is provided, a wiring group having a narrow interval is disposed on the interlayer film, a wiring group having a wide interval is disposed under the interlayer film, and a dummy wiring is disposed at a position substantially corresponding to an extension line of the wiring group having the narrow interval on the interlayer film.

According to the device substrate provided in the liquid crystal display device described in Japanese Unexamined Patent Application Publication No. 2005-338191 described above, it is said that when a resin is spread over the wiring group on a substantially parallel line in which the wiring interval is bent and changed in the middle, the occurrence of coating unevenness is suppressed. However, in recent years, with the progress of higher definition and frame narrowing of the liquid crystal display device, there is a tendency for wirings to be arranged at a narrow pitch, and it has become difficult to secure a sufficient space for installing the dummy wiring between the wirings.

The technique described in the present specification has been completed based on the above circumstances, and it is desirable to suppress unevenness in the film thickness of an alignment film even when higher definition and frame narrowing are progressed.

SUMMARY (1) According to an aspect of the technique described in the present specification, there is provided a display device including a first pixel electrode disposed in a display region, a first switching element disposed in the display region and connected to the first pixel electrode, a first wiring disposed inside and outside the display region and connected to the first switching element, a second pixel electrode disposed in the display region, a second switching element disposed in the display region and connected to the second pixel electrode, a second wiring disposed inside and outside the display region and connected to the second switching element, a third wiring disposed outside the display region and not connected to the first switching element and the second switching element, a fourth wiring disposed adjacent to the third wiring outside the display region and not connected to the first switching element and the second switching element, a first insulating film, a second insulating film disposed on an upper layer side than the first insulating film, and an alignment film disposed on an upper layer side than the second insulating film, in which the first wiring includes a first lead-out portion disposed outside the display region and located on a lower layer side of the first insulating film, the second wiring includes a second lead-out portion disposed adjacent to the first lead-out portion outside the display region and located on a lower layer side of the second insulating film on the upper layer side of the first insulating film, the third wiring is located on the lower layer side of the first insulating film, and the fourth wiring is located on the lower layer side of the second insulating film on the upper layer side of the first insulating film.

(2) According to another aspect of the technique described in the present specification, there is provided a display device including a first pixel electrode disposed in a display region, a first switching element disposed in the display region and connected to the first pixel electrode, a first wiring disposed inside and outside the display region and connected to the first switching element, a second pixel electrode disposed in the display region, a second switching element that is disposed in the display region and is connected to the second pixel electrode, a second wiring disposed inside and outside the display region and connected to the second switching element, a plurality of third wirings disposed in parallel with each other outside the display region and not connected to the first switching element and the second switching element, a first insulating film, a second insulating film disposed on an upper layer side than the first insulating film, and an alignment film disposed on an upper layer side than the second insulating film, in which the first wiring includes a first wiring main body disposed in the display region and extending along a first direction, and a first lead-out portion disposed outside the display region and located on a lower layer side of the first insulating film, the second wiring includes a second wiring main body disposed in the display region and extending along the first direction, and a second lead-out portion disposed adjacent to the first lead-out portion outside the display region and located on a lower layer side of the second insulating film on the upper layer side of the first insulating film, the first lead-out portion and the second lead-out portion are inclined at a first angle with respect to a second direction orthogonal to the first direction, and the plurality of third wirings are located on the lower layer side of the first insulating film or on the lower layer side of the second insulating film on the upper layer side of the first insulating film, and inclined at a second angle greater than the first angle with respect to the second direction.

DESCRIPTION OF THE EMBODIMENTS

Embodiment 1

Embodiment 1 will be described with reference to FIGS. 1 to 9. In the present embodiment, a liquid crystal display device 10 will be exemplified. The X-axis, Y-axis, and Z-axis are shown in a part of each drawing, and the direction of each axis is drawn in the direction shown in each drawing. Upper sides of FIGS. 2, 4, 5, 7, and 9 are defined as front sides, and lower sides of the same drawings are defined as rear sides.

Figure 1:
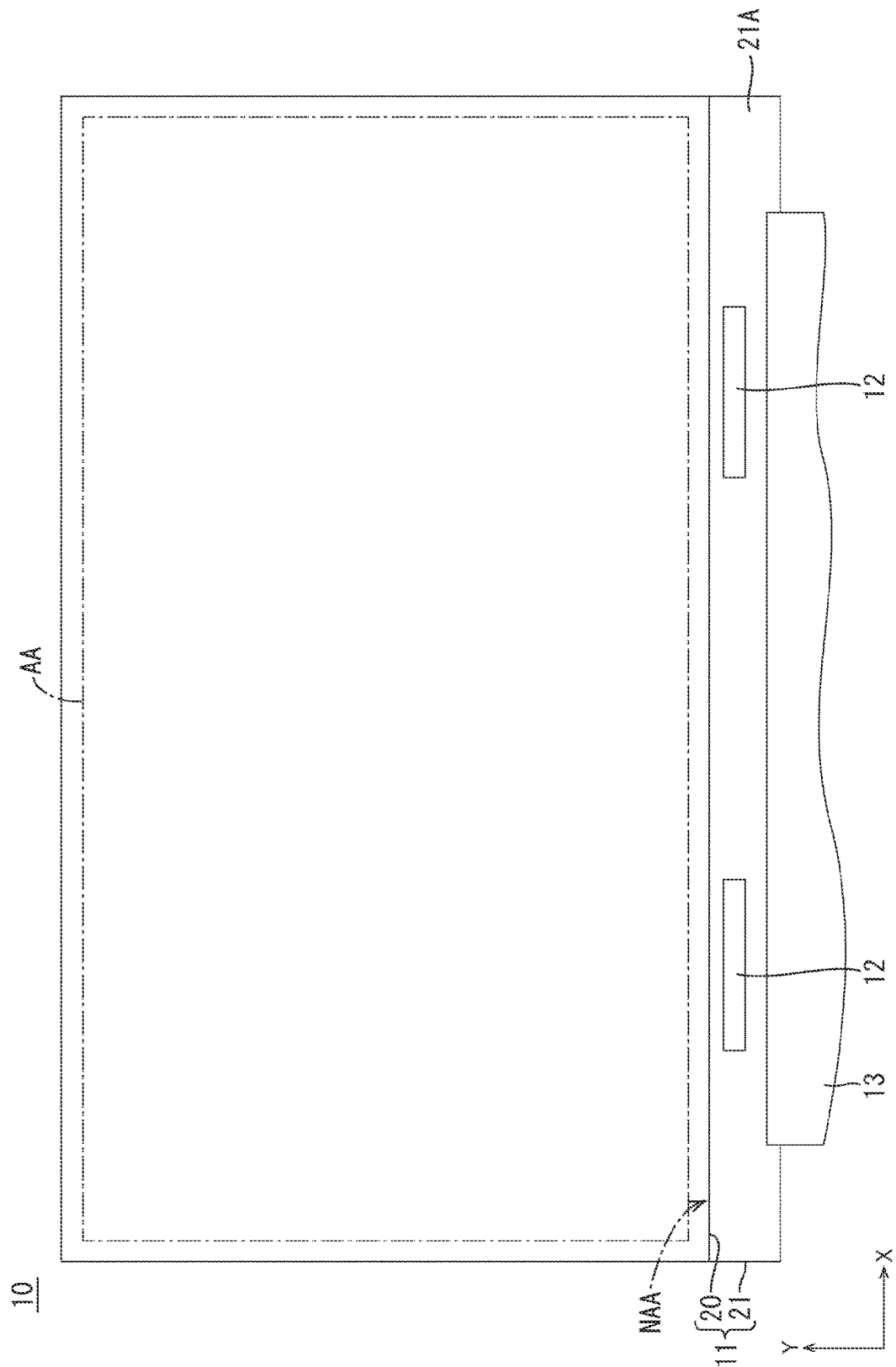
FIG. 1 is a plan view of a liquid crystal panel, a driver, and a flexible substrate that constitute a liquid crystal display device according to Embodiment 1.

As shown in FIG. 1, the liquid crystal display device 10 is provided with at least a liquid crystal panel (display device) 11 which has a horizontally long rectangular shape and can display an image, and a backlight device (lighting device) that irradiates the liquid crystal panel 11 with light for display. The backlight device is disposed on the rear side (rear surface side) of the liquid crystal panel 11, and has a light source (for example, light emitting diode (LED)) that emits white light, an optical member that converts the light from the light source into planar light by applying an optical effect, and the like. In the liquid crystal panel 11, a central portion of a screen is defined as a display region AA in which an image is displayed. In the liquid crystal panel 11, a frame-shaped (picture-frame-shaped) outer peripheral portion surrounding a display region AA on the screen is a non-display region (region outside the display region AA) NAA where no image is displayed. The display region AA is a range surrounded by a one-dot chain line in FIG. 1.

Figure 2:
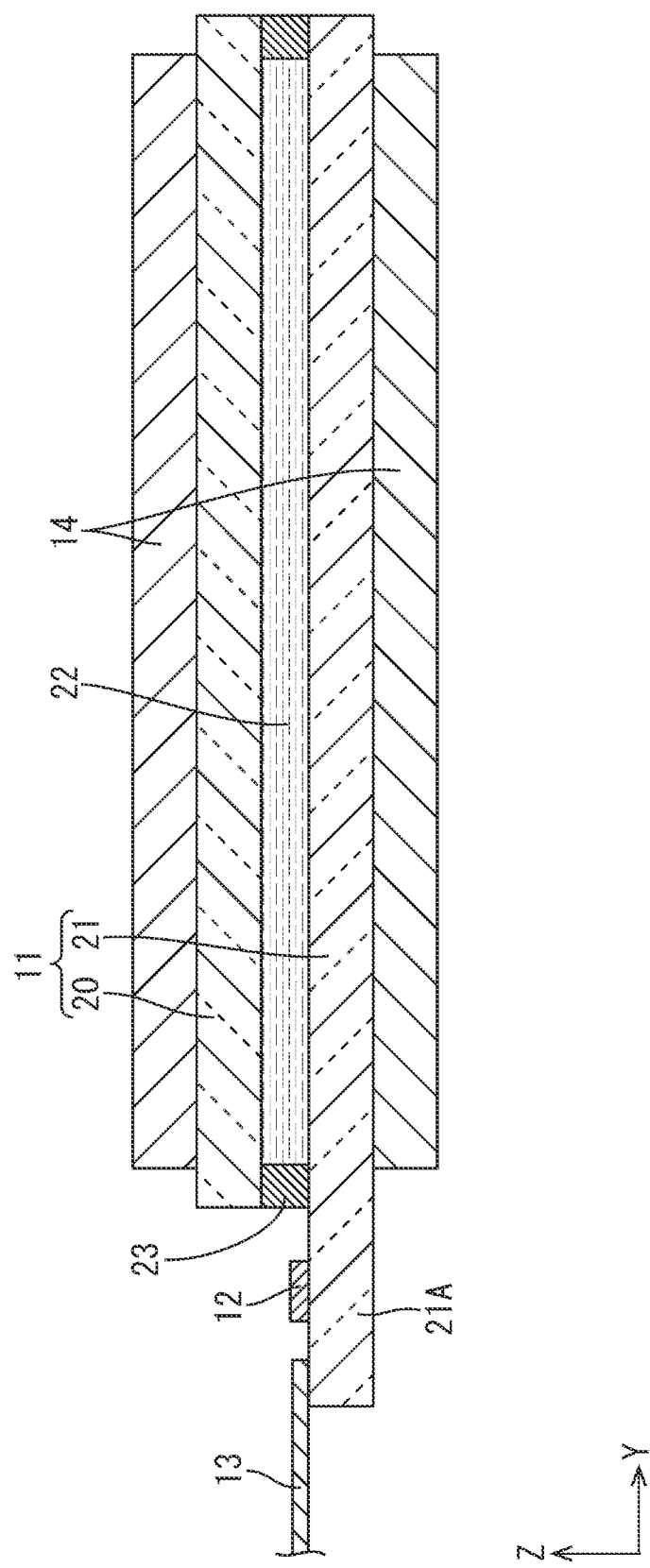
FIG. 2 is a cross-sectional view of the liquid crystal panel, the driver, and the flexible substrate according to Embodiment 1.

The liquid crystal panel 11 will be described with reference to FIG. 2, in addition to FIG. 1. As shown in FIGS. 1 and 2, the liquid crystal panel 11 is formed by attaching a pair of substrates 20 and 21. The front side of the pair of substrates 20 and 21 is a counter substrate (second substrate) 20, and the rear side is an array substrate (first substrate) 21. Both the counter substrate 20 and the array substrate 21 are formed by laminating various films on the inner surface side of a glass substrate. A liquid crystal layer 22 containing a liquid crystal molecule, which is a substance whose optical performance changes with the application of an electric field, is interposed and disposed between the pair of substrates 20 and 21. A seal portion 23 for sealing the liquid crystal layer 22 is interposed between the outer peripheral end portions of the pair of substrates 20 and 21. The seal portion 23 is formed in a square frame shape so as to surround the liquid crystal layer 22. A polarizing plate 14 is attached to each of the outer surface sides of both substrates 20 and 21.

As shown in FIGS. 1 and 2, the array substrate 21 is larger than the counter substrate 20, and a part thereof is a protrusion portion 21A that protrudes laterally from the counter substrate 20. The protrusion portion 21A is exposed without being covered with the counter substrate 20. The entire area of the protrusion portion 21A is a non-display region NAA, and a driver 12 and a flexible substrate 13 for supplying various signals are mounted. The driver 12 is made of an LSI chip having a drive circuit inside. The driver 12 is mounted on the protrusion portion 21A on the array substrate 21 by chip on glass (COG). The driver 12 is disposed adjacent to one side of the display region AA in the Y-axis direction, and is interposed between the flexible substrate 13 and the display region AA. The driver 12 has a horizontally long rectangular planar shape. Two drivers 12 are disposed at positions at intervals in the protrusion portion 21A in the X-axis direction. The driver 12 processes various signals transmitted by the flexible substrate 13. The flexible substrate 13 has a configuration in which multiple wiring patterns are formed on a base material having insulating properties and flexibility. One end side of the flexible substrate 13 is connected to the array substrate 21, and the other end side is connected to an external control substrate (signal supply source), respectively. Various signals supplied from the control substrate are transmitted to the liquid crystal panel 11 via the flexible substrate 13.

Figure 3:
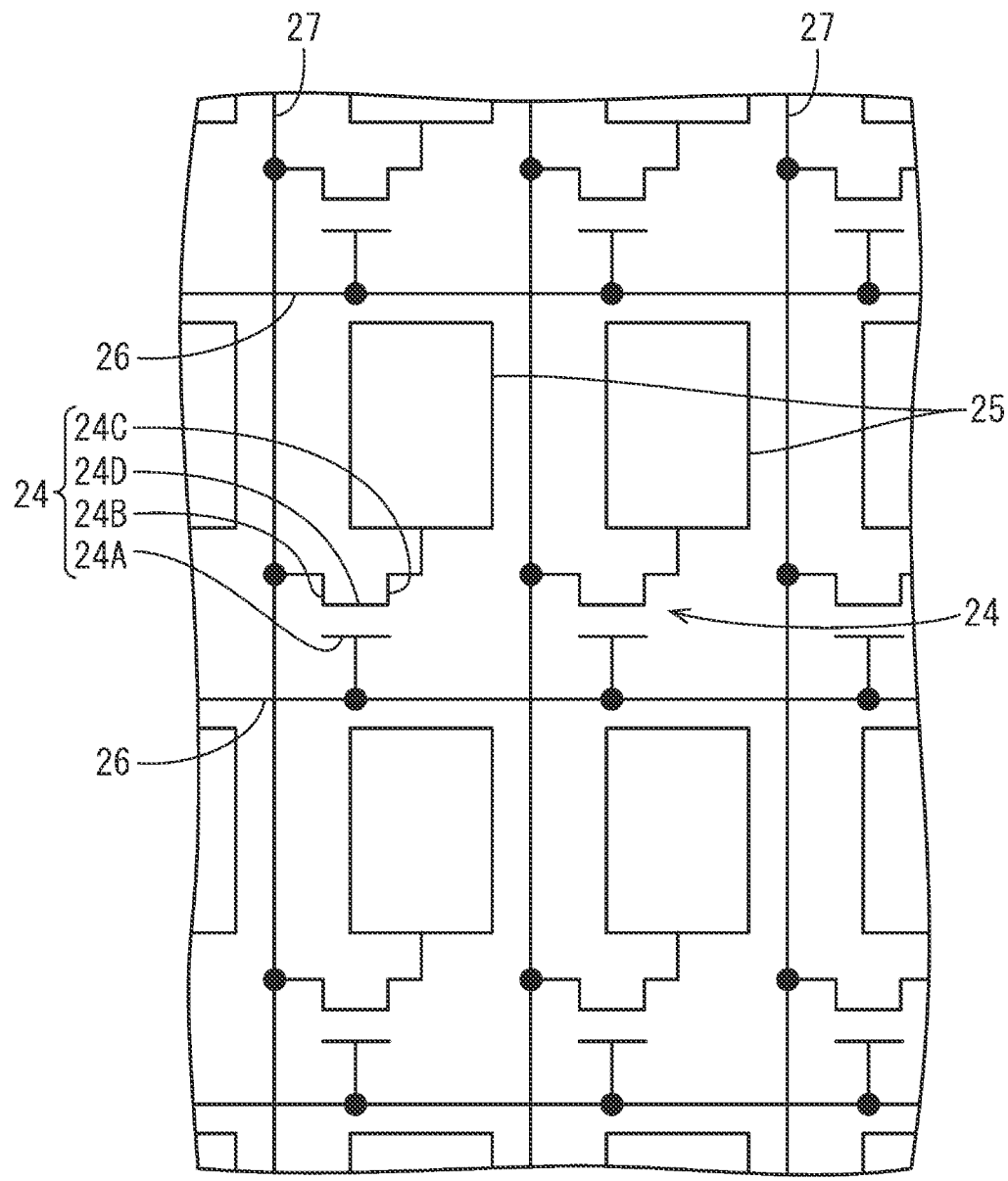
FIG. 3 is a circuit diagram showing a pixel array in a display region of an array substrate provided in the liquid crystal panel according to Embodiment 1.

Next, the configuration of the display region AA on the liquid crystal panel 11 will be described with reference to FIGS. 3 and 4. At least a thin film transistor (TFT, switching element) 24 and a pixel electrode 25 are provided on the inner surface side of the display region AA on the array substrate 21, as shown in FIG. 3. A plurality of the TFTs 24 and a plurality of the pixel electrodes 25 are provided in a matrix shape (rows and rows) side by side at intervals along the X-axis direction and the Y-axis direction. A gate wiring (scanning wiring) 26 and a source wiring (image wiring, signal wiring) 27 are disposed to be orthogonal to (intersect) each other around these TFTs 24 and the pixel electrodes 25. The gate wiring 26 extends along the X-axis direction. The source wiring 27 extends along the Y-axis direction. The TFT 24 includes a gate electrode 24A connected to the gate wiring 26, a source electrode 24B connected to the source wiring 27, a drain electrode 24C connected to the pixel electrode 25, and a semiconductor portion 24D made of semiconductor material and connected to the source electrode 24B and the drain electrode 24C. The TFT 24 is driven based on a scanning signal supplied to the gate electrode 24A through the gate wiring 26. As a result, the potential associated with the image signal (data signal) supplied from the driver 12 to the source electrode 24B through the source wiring 27 is supplied to the drain electrode 24C via the semiconductor portion 24D. As a result, the pixel electrode 25 is charged to the potential associated with the image signal. The pixel electrode 25 is disposed in a region surrounded by the gate wiring 26 and the source wiring 27, and has a substantially rectangular planar shape, for example.

Figure 4:
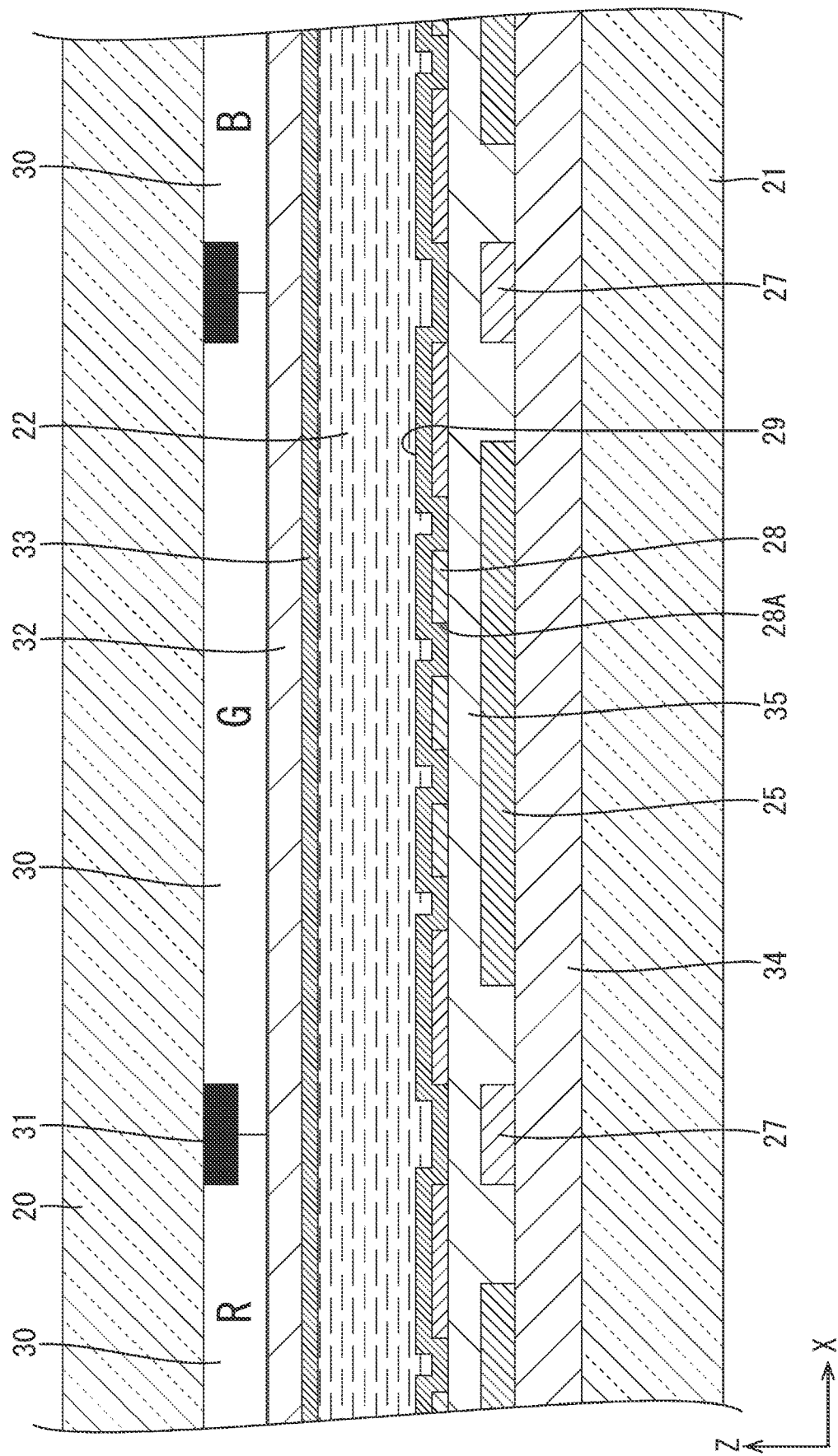
FIG. 4 is a cross-sectional view of a pixel electrode and the like in a display region of the liquid crystal panel according to Embodiment 1.

A common electrode 28 is provided on the inner surface side of the display region AA of the array substrate 21, as shown in FIG. 4. The common electrode 28 is located on the upper layer side than the pixel electrode 25, and is disposed over substantially the entire display region AA. As a result, the common electrode 28 overlaps with all the pixel electrodes 25 disposed in the display region AA. A plurality of slits 28A are opened in portions of the common electrode 28 overlapping with the plurality of the pixel electrodes 25, respectively. A common potential signal serving as a common potential (reference potential) is supplied to the common electrode 28. When the pixel electrode 25 is charged to a potential based on the image signal transmitted to the source wiring 27 as the TFT 24 is driven, a potential difference occurs between the pixel electrode 25 and the common electrode 28. As a result, a fringe electric field (oblique electric field) is generated that includes a component in the normal direction to the plate surface of the array substrate 21, in addition to the component along the plate surface of the array substrate 21, between the opening edge of the slit 28A in the common electrode 28 and the pixel electrode 25. Therefore, by utilizing this fringe electric field, an alignment state of the liquid crystal molecules contained in the liquid crystal layer 22 can be controlled, and a predetermined display is made based on the alignment state of the liquid crystal molecules. That is, the operation mode of the liquid crystal panel 11 according to the present embodiment is a fringe field switching (FFS) mode. A first alignment film 29 for aligning the liquid crystal contained in the liquid crystal layer 22 is provided on the inner surface side of the display region AA on the array substrate 21. The first alignment film 29 is located on the upper layer side of the common electrode 28, and the upper surface thereof is in contact with the liquid crystal layer 22. In the first alignment film 29, the liquid crystal molecules can be aligned by subjecting the upper surface facing the liquid crystal layer 22 to the optical alignment treatment.

As shown in FIG. 4, a large number of color filters 30 are provided at positions overlapping with each pixel electrode 25 provided on the array substrate 21 on the inner surface side of the display region AA on the counter substrate 20. The color filters 30 are disposed such that three colors of red (R), green (G), and blue (B) are repeatedly and alternately disposed along the X-axis direction, and are arranged in stripes as a whole by extending along the Y-axis direction. A light shielding portion (black matrix) 31 is provided to avoid color mixture by partitioning between the color filters 30 adjacent to each other on the inner surface side of the display region AA on the counter substrate 20. The light shielding portion 31 is also provided in the non-display region NAA. The light shielding portion 31 has a lattice shape so as to overlap with the gate wiring 26 and the source wiring 27 in the display region AA, but has a solid shape in the non-display region NAA. An overcoat film 32 is formed on the upper layer side of the color filter 30 and the light shielding portion 31. The overcoat film 32 is provided in a substantially solid shape over a range straddling the display region AA and the non-display region NAA on the counter substrate 20. The overcoat film 32 is made of an organic material such as an acrylic resin (for example, PMMA or the like) and functions to flatten a step difference generated on the lower layer side than the overcoat film 32. A second alignment film 33 for aligning the liquid crystal contained in the liquid crystal layer 22 is provided on the upper layer side (innermost surface of the counter substrate 20) of the overcoat film 32. The second alignment film 33 is located on the uppermost layer of the counter substrate 20, and the upper surface thereof is in contact with the liquid crystal layer 22. In the second alignment film 33, the liquid crystal molecules can be aligned by subjecting the upper surface facing the liquid crystal layer 22 to the optical alignment treatment.

Figure 5:
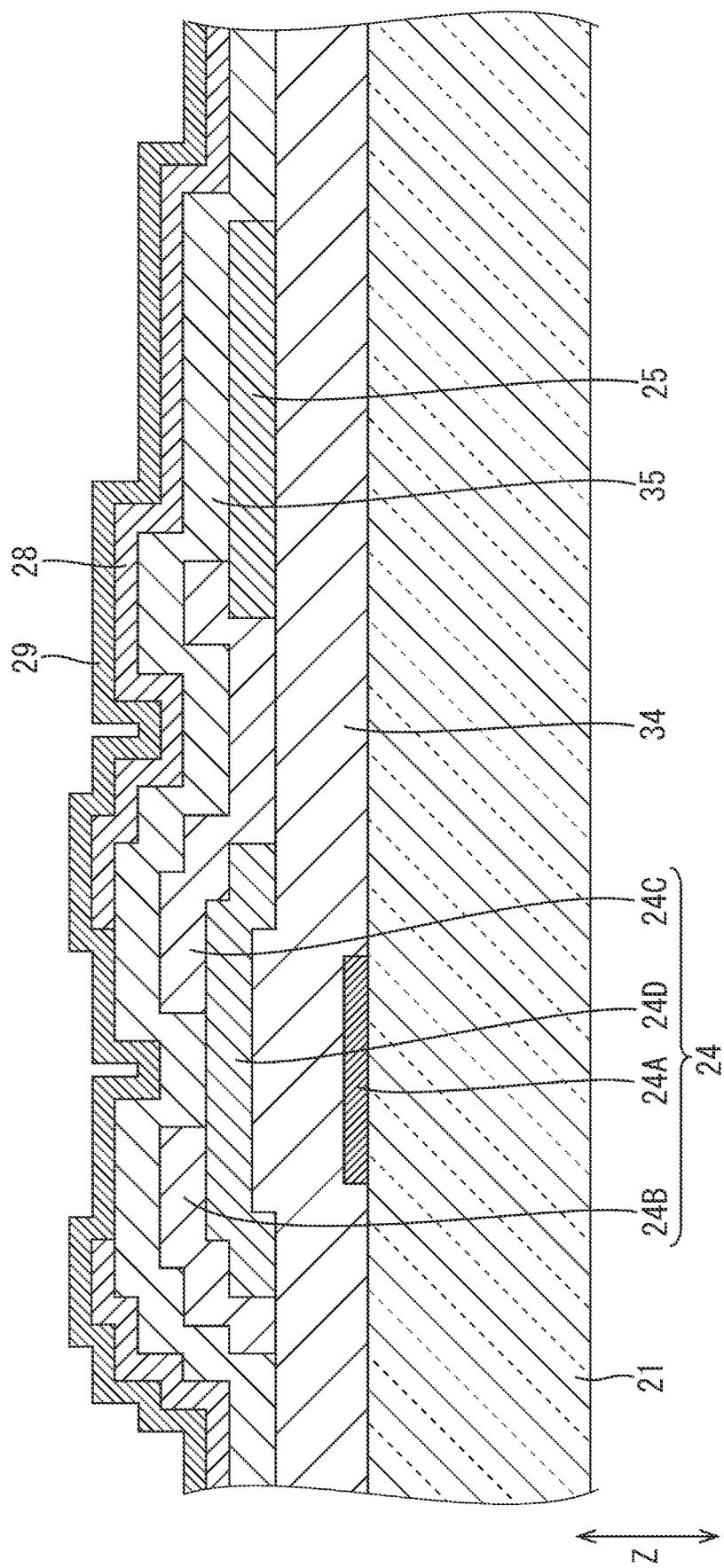
FIG. 5 is a cross-sectional view of a thin film transistor (TFT) provided on the array substrate according to Embodiment 1.

Here, various films laminated on the inner surface side of the array substrate 21 will be described with reference to FIG. 5. As shown in FIG. 5, on the array substrate 21, a first metal film, a first insulating film 34, a semiconductor film, a semiconductor film, a first transparent electrode film, a second metal film, a second insulating film 35, a second transparent electrode film, and a first alignment film 29 are laminated in this order from the lower layer side (glass substrate side).

Each of the first metal film and the second metal film has conductivity and light shielding properties by being a single-layer film made of one type of metal material selected from copper, titanium, aluminum, molybdenum, tungsten, and the like, or a laminated film made of different types of metal materials or alloy. The first metal film constitutes the gate wiring 26, the gate electrode 24A of the TFT 24, and the like. The second metal film constitutes all or a part of the source wiring 27, the source electrode 24B and the drain electrode 24C of the TFT 24, and the like. The first insulating film 34 and the second insulating film 35 are made of inorganic materials such as silicon nitride ($SiN_x$) and silicon oxide ($SiO_2$), respectively. The first insulating film 34 keeps the first metal film on the lower layer side, and the semiconductor film, the first transparent electrode film, and the second metal film on the upper layer side in an insulated state. The second insulating film 35 keeps the semiconductor film, the first transparent electrode film, and the second metal film on the lower layer side, and the second transparent electrode film on the upper layer side in an insulated state. The semiconductor film is made of a thin film using, for example, an oxide semiconductor, amorphous silicon, or the like as a material, and constitutes the semiconductor portion 24D of the TFT 24 and the like. The first transparent electrode film and the second transparent electrode film are made of a transparent electrode material (for example, indium tin oxide (ITO) or indium zinc oxide (IZO)). The first transparent electrode film constitutes the pixel electrode 25 and the like. The second transparent electrode film constitutes the common electrode 28 and the like. The first alignment film 29 is made of an organic material such as polyimide. The second alignment film 33 provided on the counter substrate 20 is also made of an organic material such as polyimide, similar to the first alignment film 29.

Figure 6:
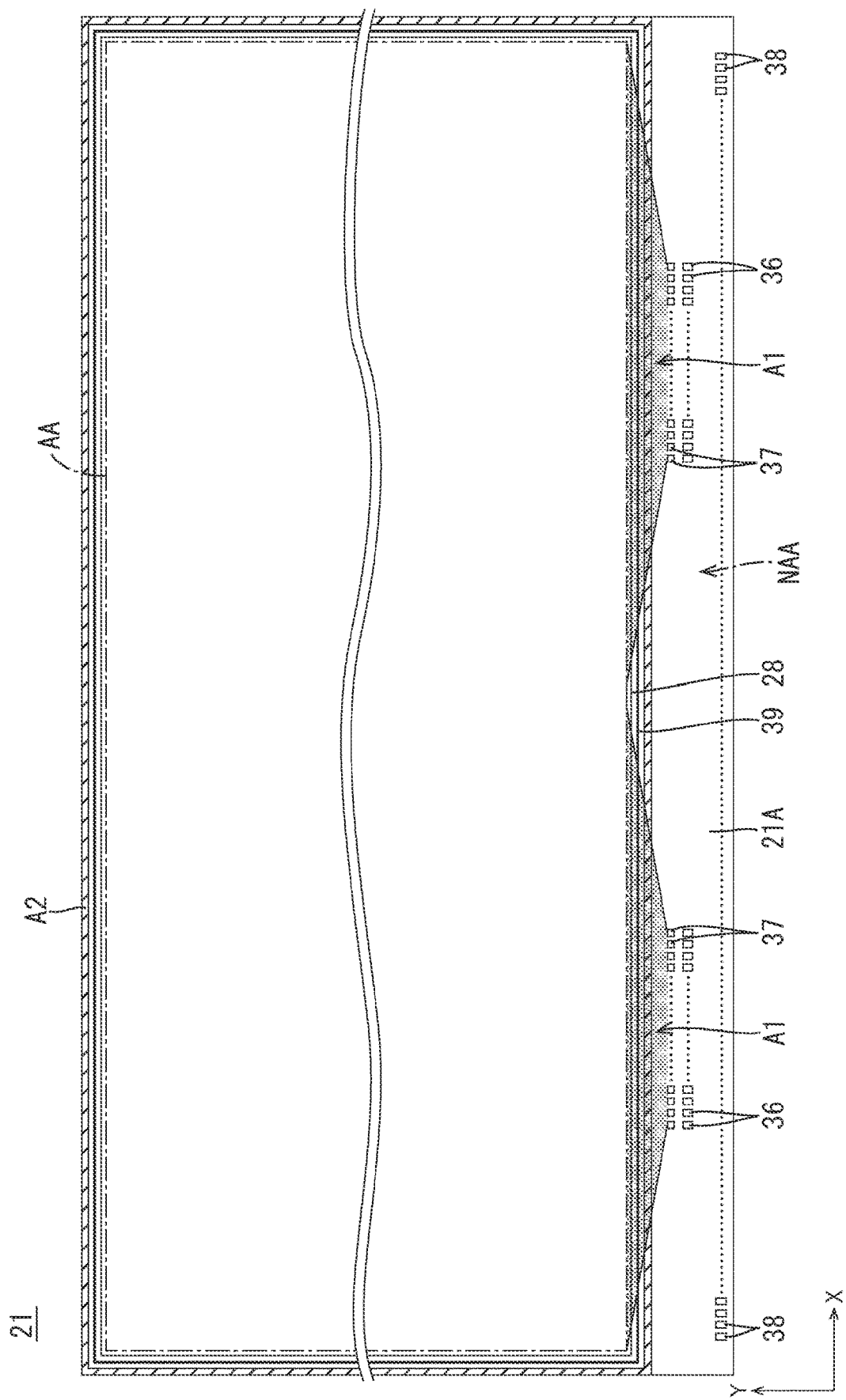
FIG. 6 is a plan view of the array substrate according to Embodiment 1.

Next, the configuration of the non-display region NAA (outside the display region AA) on the array substrate 21 will be described with reference to FIGS. 6 to 9. As shown in FIG. 6, a plurality of terminals 36 to 38 are provided on a long side portion including the protrusion portion 21A of the frame-shaped non-display region NAA on the array substrate 21. The plurality of the terminals 36 to 38 are formed by laminating at least one of the same first transparent electrode film as the pixel electrode 25 and the like and the same second transparent electrode film as the common electrode 28 and the like on at least one of the same first metal film as the gate wiring 26 and the like and the same second metal film as the source wiring 27 and the like. All of the plurality of the terminals 36 to 38 have a rectangular planar shape. The plurality of the terminals 36 to 38 include an input terminal 36 and an output terminal 37 connected to the driver 12, and a terminal 38 connected to the flexible substrate 13. Among these terminals, the plurality of the terminals 38 are disposed side by side in the mounting region of the flexible substrate 13 of the protrusion portion 21A at linear intervals along the X-axis direction. The plurality of the terminals 38 includes the terminal 38 to which a common potential signal is input from the flexible substrate 13, the terminal 38 to which a ground potential signal is input, and the like, in addition to the terminal 38 to which a signal to be supplied from the flexible substrate 13 to the driver 12 is input.

As shown in FIG. 6, a plurality of the input terminals 36 and a plurality of the output terminals 37 are provided in the mounting region of each driver 12 of the protrusion portion 21A which is the non-display region NAA. The input terminal 36 is a terminal for inputting the signal to the driver 12. The input terminal 36 is located on the side closer to the terminal 38 (flexible substrate 13) and on the side far from the display region AA in the Y-axis direction from the output terminal 37 in the mounting region of the driver 12. The plurality of the input terminals 36 are disposed side by side at linear intervals along the X-axis direction. The output terminal 37 is a terminal for receiving an output of the signal from the driver 12. The signal output from the driver 12 to the output terminal 37 includes at least an image signal. The output terminal 37 is located on the side far from the terminal 38 (flexible substrate 13) and on the side closer to the display region AA in the Y-axis direction from the input terminal 36 in the mounting region of the driver 12. The plurality of the output terminals 37 are disposed side by side at linear intervals along the X-axis direction.

Figure 8:
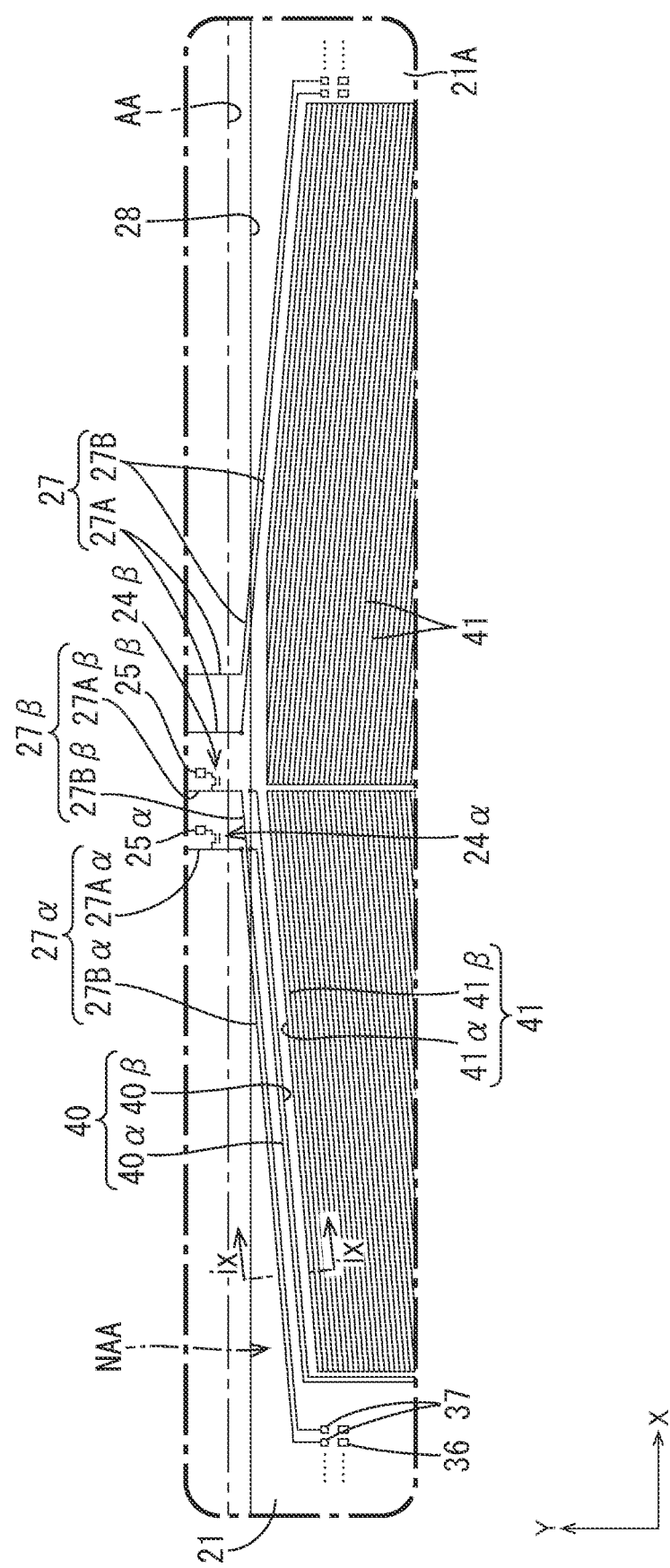
FIG. 8 is an enlarged plan view of the vicinity of a protrusion portion on the array substrate according to Embodiment 1.

As shown in FIG. 8, end portions of the source wiring 27 are connected to the plurality of the output terminals 37. The source wiring 27 is disposed over the display region AA and the non-display region NAA. Specifically, the source wiring 27 includes a wiring main body 27A extending along the Y-axis direction (first direction) in the display region AA, and a lead-out portion 27B that is routed from the wiring main body 27A to the output terminal 37 in the non-display region NAA. The end portion of the lead-out portion 27B opposite to the wiring main body 27A side is connected to the output terminal 37. FIG. 6 shows a formation range A1 of the lead-out portion 27B of the source wiring 27 on the array substrate 21 in a mesh shape. A plurality of the lead-out portions 27B are disposed so as to extend in a fan shape from the plurality of the output terminals 37 toward the display region AA (wiring main body 27A). As a result, as shown in FIG. 6, the formation range A1 of the lead-out portion 27B has a substantially reverse trapezoidal planar shape. The lead-out portion 27B is inclined at a predetermined angle with respect to the X-axis direction.

Figure 7:
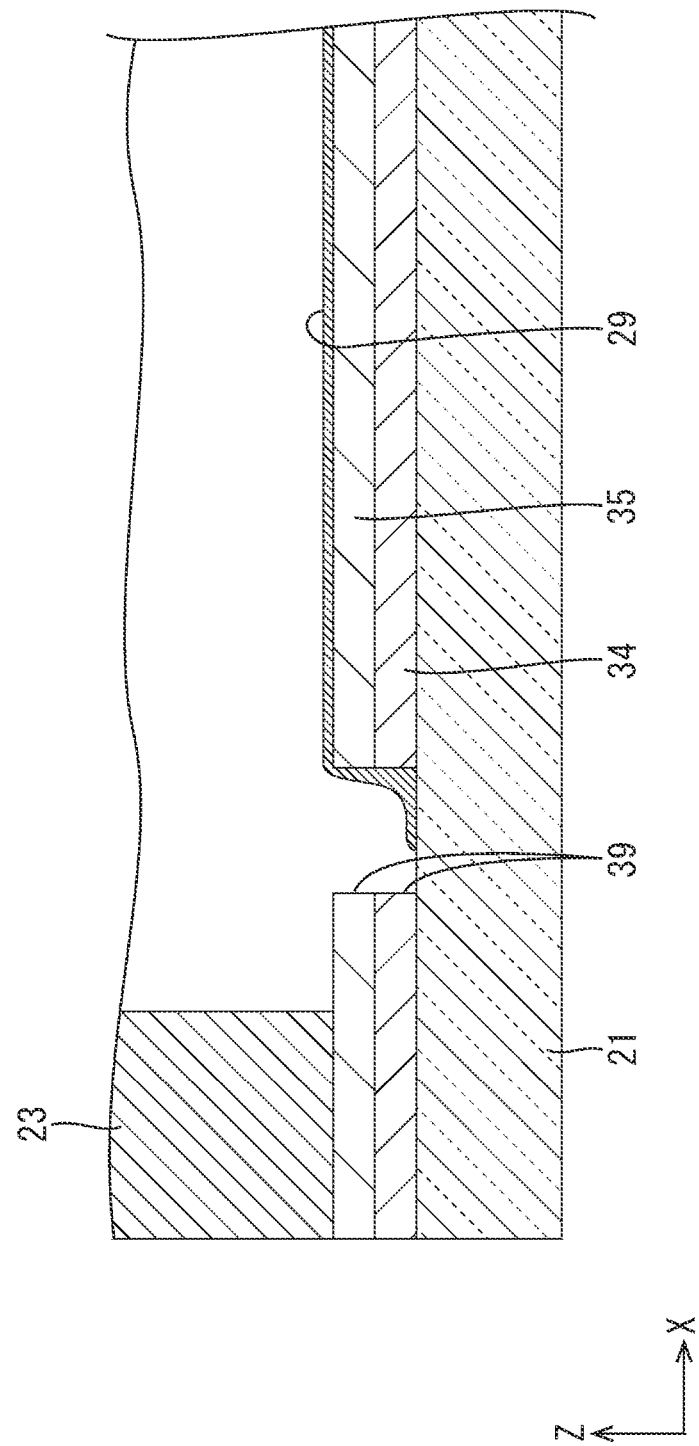
FIG. 7 is a cross-sectional view of an end portion of the liquid crystal panel according to Embodiment 1.

As shown in FIGS. 6 and 7, a regulating groove portion 39 that regulates a film forming range of the first alignment film 29 is provided in the non-display region NAA of the array substrate 21. The regulating groove portion 39 is disposed inward from the seal portion 23 (near the display region AA). The regulating groove portion 39 extends along the seal portion 23 over the entire circumference of the seal portion 23, and is provided in a rectangular frame-shaped range when viewed in a plan view. The regulating groove portion 39 penetrates the first insulating film 34 and the second insulating film 35 in the film thickness direction (Z-axis direction) in the non-display region NAA, and has openings formed in the first insulating film 34 and the second insulating film 35. In FIG. 6, a formation range A2 of the seal portion 23 on the array substrate 21 is shown in a mesh shape. As shown in FIG. 6, the common electrode 28 has a formation range one size larger than that of the display region AA, and an outer peripheral end portion thereof is located in the non-display region NAA.

Here, when forming the first alignment film 29 in a manufacturing process of the array substrate 21, for example, the material of the first alignment film 29 is applied to the upper layer side of the common electrode 28 (upper layer side than the second insulating film 35) in the display region AA of the array substrate 21 using an ink jet type coating device or the like. The material of the applied first alignment film 29 is made to flow so that the material is spread over at least the entire display region AA on the array substrate 21. Therefore, a material having a sufficiently low viscosity and high fluidity is used as the material of the first alignment film 29. The material of the first alignment film 29 having high fluidity spreads to the non-display region NAA outside the display region AA, and flows on the upper surface of the second insulating film 35 in the non-display region NAA. In the non-display region NAA, the film forming range of the material of the first alignment film 29 is regulated by a regulating groove portion 39 provided by partially recessing the first insulating film 34 and the second insulating film 35 at a position just before reaching the formation range A2 of the seal portion 23. As a result, it is possible to avoid the material of the first alignment film 29 from reaching the formation range A2 of the seal portion 23, so that when the array substrate 21 is attached to the counter substrate 20, it is possible to avoid a situation in which the seal portion 23 overlaps with the first alignment film 29 and comes into contact with the first alignment film 29. Since the first alignment film 29 has poor adhesion to the seal portion 23, contact with the seal portion 23 is avoided as described above, and thus the adhesive strength of the seal portion 23 is improved, and peeling of the seal portion 23 is unlikely to occur.

As shown in FIG. 8, a common wiring 40 and a dummy wiring 41 are provided in the long side portion including the protrusion portion 21A in the non-display region NAA of the array substrate 21. The common wiring 40 and the dummy wiring 41 are disposed in a region (central portion in the X-axis direction) interposed between at least two mounting regions of the driver 12 of the above-described long side portion of the non-display region NAA on the array substrate 21. The common wiring 40 and the dummy wiring 41 may be disposed on the end side in the X-axis direction with respect to the mounting region of each driver 12 of the above-described long side portion of the non-display region NAA on the array substrate 21. In any case, the common wiring 40 and the dummy wiring 41 are disposed adjacent to each other with respect to the formation range A1 of the lead-out portion 27B of the source wiring 27 in the X-axis direction. As described above, the common wiring 40 and the dummy wiring 41 are disposed so as to planarly fill a space (range) where the lead-out portion 27B of the source wiring 27 is not formed in the above-described long side portion of the non-display region NAA on the array substrate 21. The common wiring 40 and the dummy wiring 41 are inclined by a predetermined angle with respect to the X-axis direction. The inclination angles of the common wiring 40 and the dummy wiring 41 with respect to the X-axis direction are substantially the same as the inclination angle of the lead-out portion 27B with respect to the X-axis direction. That is, the common wiring 40 and the dummy wiring 41 are parallel to the lead-out portion 27B. As a result, an interval between the common wiring 40 and the lead-out portion 27B disposed adjacent to each other becomes substantially fixed along the length direction, and an interval between the dummy wiring 41 and the lead-out portion 27B disposed adjacent to each other becomes substantially fixed along the length direction. Therefore, it is possible to keep a space in which none of the lead-out portion 27B, the common wiring 40, and the dummy wiring 41 are formed small in the above-described long side portion of the non-display region NAA on the array substrate 21. At least the common wiring 40 and the dummy wiring 41 are present between the display region AA and the regulating groove portion 39 (refer to FIG. 6) in the above-described long side portion of the non-display region NAA on the array substrate 21. At least a part of the common wiring 40 and the dummy wiring 41 is disposed to overlap with the liquid crystal layer 22.

As shown in FIG. 8, in the common wiring 40, one end portion (end portion on the side close to the display region AA) is connected to a portion of the common electrode 28 located in the non-display region NAA (a part of the outer peripheral end portion). A plurality of the common wirings 40 are disposed side by side at intervals. The plurality of the common wirings 40 are parallel to each other. The other end portions (end portions on the side opposite to the end portions connected to the common electrode 28) of the plurality of the common wirings 40 are connected to the terminals 38 to which a common potential signal is supplied by the flexible substrate 13 among the plurality of the terminals 38, respectively. The plurality of the common wirings 40 are at the same potential (common potential). A common potential signal is supplied to the common electrode 28 through the common wiring 40.

As shown in FIG. 8, the dummy wiring 41 is not connected to wirings, electrodes, and the like provided on the array substrate 21, and is electrically isolated. A plurality of the dummy wirings 41 are disposed side by side at intervals. The plurality of the dummy wirings 41 are parallel to each other and are connected to each other. The plurality of the dummy wirings 41 do not have an electrical function such as transmitting a specific signal. As described above, since the dummy wiring 41 is electrically isolated, the degree of freedom in a disposition in the non-display region NAA is increased within the range of not interfering (short-circuiting, or the like) with other wirings, electrodes, or the like. Therefore, it is possible to dispose the dummy wirings 41 in most of the spaces where the lead-out portion 27B is not disposed in the non-display region NAA. As a result, it is possible to further reduce the space in which none of the lead-out portion 27B, the common wiring 40, and the dummy wiring 41 are formed in the above-described long side portion of the non-display region NAA on the array substrate 21. Here, in a range of the non-display region NAA where none of the lead-out portion 27B, the common wiring 40, and the dummy wiring 41 are formed, the first alignment film 29 is disposed lower in the Z-axis direction and the thickness of the liquid crystal layer 22 is increased, compared with a range in which any one of the lead-out portion 27B, the common wiring 40, and the dummy wiring 41 is formed. In this respect, as described above, since the common wiring 40 and the dummy wiring 41 are provided in most of the spaces where the lead-out portion 27B is not disposed in the non-display region NAA, the interval between the counter substrate 20 and the array substrate 21 in the non-display region NAA, that is, the thickness of the liquid crystal layer 22 can be made uniform. As a result, since vacuum bubbles are unlikely to be generated in the liquid crystal layer 22, deterioration of display quality caused by the vacuum bubbles is suppressed.

Figure 9:
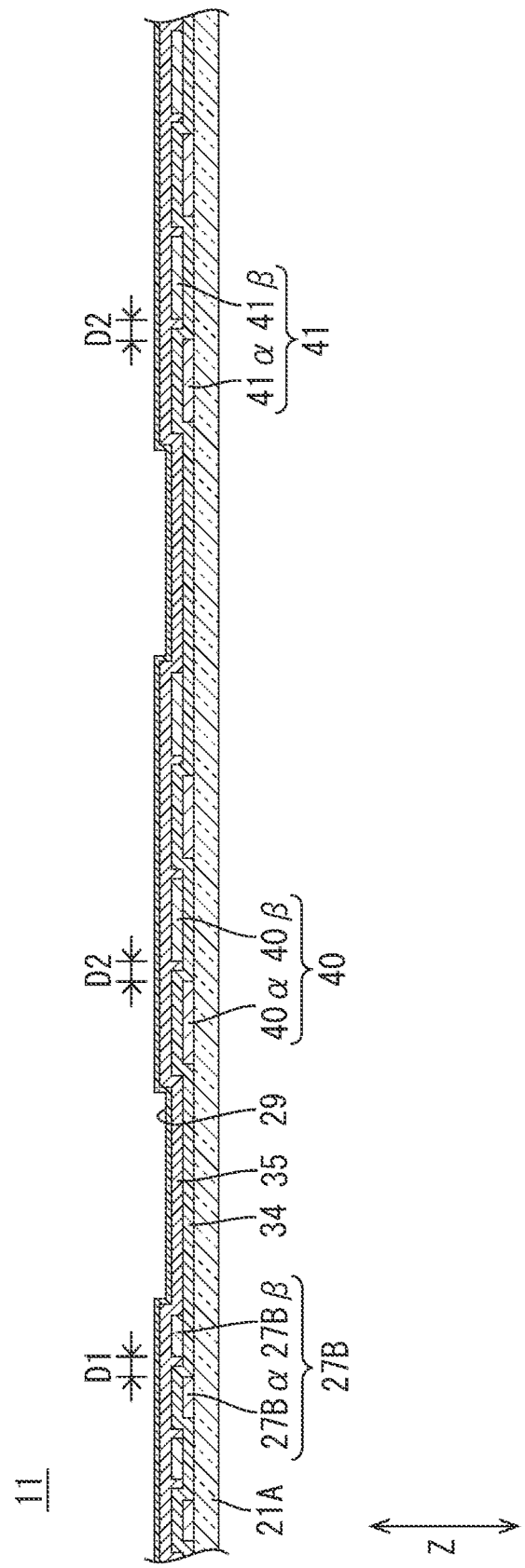
FIG. 9 is a cross-sectional view of the array substrate according to Embodiment 1 taken along the line ix-ix in FIG. 8.

As shown in FIGS. 8 and 9, a plurality of the source wirings 27 include two types of a first source wiring (first wiring) 27α made of a first metal film and a second metal film and a second source wiring (second wiring) 27β made of a second metal film. The first source wiring 27α includes a first wiring main body 27Aα made of the second metal film and a first lead-out portion 27Bα made of the first metal film. The second source wiring 27β includes a second wiring main body 27Aβ made of the second metal film and a second lead-out portion 27Bβ made of the second metal film. Hereinafter, in a case where the source wiring 27, the wiring main body 27A, and the lead-out portion 27B are distinguished, a suffix α is added to each reference numeral of "first source wiring", "first wiring main body", and "first lead-out portion", and a suffix β is added to each reference numeral of "second source wiring", "second wiring main body", and "second lead-out portion", and in the case of being collectively referred to without distinction, a suffix is not added to the reference numeral.

Hereinafter, in a case where the TFT 24 is distinguished, the TFT 24 connected to the first wiring main body 27Aα of the first source wiring 27α is defined as a "first TFT" and a suffix α is added to the reference numeral thereof, and the TFT 24 connected to the second wiring main body 27Aβ of the second source wiring 27β is defined as a "second TFT" and a suffix β is added to the reference numeral thereof, and in the case of being collectively referred to without distinction, a suffix is not added to the reference numeral. Hereinafter, in a case where the pixel electrode 25 is distinguished, the pixel electrode 25 connected to the first TFT 24α is defined as a "first pixel electrode" and a suffix α is added to a reference numeral thereof, and the pixel electrode 25 connected to the second TFT 24β is defined as a "second pixel electrode" and a suffix β is added to a reference numeral thereof, and in the case of being collectively referred to without distinction, a suffix is not added to the reference numeral.

Incidentally, the array substrate 21 according to the present embodiment has a configuration without a flattening film made of an organic material as an insulating film. Therefore, as compared with the case of including the flattening film, the flatness of the inner surface of the array substrate 21 tends to decrease. When the flatness of the inner surface of the array substrate 21 is low, and the first alignment film 29 is formed, the fluidity of the applied material of the first alignment film 29 tends to be inhibited due to the unevenness generated on the inner surface of the array substrate 21. When the fluidity of the material of the first alignment film 29 is low, there is a concern that the unevenness in the film thickness occurs in the first alignment film 29 to be formed.

Therefore, in the present embodiment, as shown in FIGS. 8 and 9, the plurality of the common wirings 40 and the plurality of the dummy wirings 41 include two types of a first common wiring (third wiring) 40α and a first dummy wiring (third wiring) 41α made of a first metal film, and a second common wiring (fourth wiring) 40β and a second dummy wiring (fourth wiring) 41β made of a second metal film. Hereinafter, in a case where the common wiring 40 and the dummy wiring 41 are distinguished, a suffix α is added to each reference numeral of "first common wiring" and "first dummy wiring", and a suffix β is added to each reference numeral of "second common wiring" and "second dummy wiring", and in the case of being collectively referred to without distinction, a suffix is not added to the reference numeral.

As shown in FIG. 9, the first lead-out portion 27Bα, the first common wiring 40α, and the first dummy wiring 41α, which are made of the first metal film, are all disposed on the lower layer side of the first insulating film 34. The second lead-out portion 27Bβ, the second common wiring 40β, and the second dummy wiring 41β, which are made of the second metal film, are all disposed on the lower layer side of the second insulating film 35 on the upper layer side of the first insulating film 34. The first lead-out portion 27Bα and the second lead-out portion 27Bβ are disposed adjacent to each other, and are kept in an insulated state from each other by the first insulating film 34. As a result, since the arrangement interval between the first lead-out portion 27Bα and the second lead-out portion 27Bβ can be narrowed, it is suitable for achieving higher definition and frame narrowing of the liquid crystal panel 11. Moreover, since the second lead-out portion 27Bβ is on the upper layer side of the first insulating film 34, the second lead-out portion 27Bβ is disposed at approximately the same height in the Z-axis direction as a portion of the first insulating film 34 that rides on the first lead-out portion 27Bα. Therefore, a portion of the second insulating film 35 that rides on the second lead-out portion 27Bβ is disposed at approximately the same height in the Z-axis direction as a portion of the second insulating film 35 that overlaps with the first lead-out portion 27Bα. As described above, the flatness of the portion of the second insulating film 35 disposed so as to straddle the first lead-out portion 27Bα and the second lead-out portion 27Bβ is increased.

As shown in FIG. 9, since the second common wiring 40β is on the upper layer side of the first insulating film 34, the second common wiring 40β is disposed at approximately the same height in the Z-axis direction as a portion of the first insulating film 34 that rides on the first common wiring 40α. Therefore, a portion of the second insulating film 35 that rides on the second common wiring 40β is disposed at approximately the same height in the Z-axis direction as a portion of the second insulating film 35 that overlaps with the first common wiring 40α. As described above, in addition to increasing flatness, the portion of the second insulating film 35 disposed so as to straddle the first common wiring 40α and the second common wiring 40β has a flatness close to that of the portion of the second insulating film 35 disposed so as to straddle the first lead-out portion 27Bα and the second lead-out portion 27Bβ. Since the second dummy wiring 41β is on the upper layer side of the first insulating film 34, the second dummy wiring 41β is disposed at approximately the same height in the Z-axis direction as a portion of the first insulating film 34 that rides on the first dummy wiring 41α. Therefore, a portion of the second insulating film 35 that rides on the second dummy wiring 41β is disposed at approximately the same height in the Z-axis direction as a portion of the second insulating film 35 that overlaps with the first dummy wiring 41α. As described above, in addition to increasing flatness, the portion of the second insulating film 35 disposed so as to straddle the first dummy wiring 41α and the second dummy wiring 41β has a flatness close to that of the portion of the second insulating film 35 disposed so as to straddle the first lead-out portion 27Bα and the second lead-out portion 27Bβ.

As described above, as shown in FIG. 9, the flatness of the second insulating film 35 in the long side portion including the protrusion portion 21A in the non-display region NAA of the array substrate 21 is made uniform in each disposition region of the lead-out portion 27B, the common wiring 40, and the dummy wiring 41. Therefore, when the first alignment film 29 is formed on the upper layer side than the second insulating film 35, the flow of the material of the first alignment film 29 spreading from the display region AA to the non-display region NAA is unlikely to be hindered due to unevenness that may occur on the surface in each disposition region of the common wiring 40 and the dummy wiring 41 among the second insulating film 35. Since the first alignment film 29 formed in this manner is unlikely to have the unevenness in the film thickness, particularly in the outer peripheral end side portion of the display region AA, the display quality of the image displayed in the display region AA is improved. According to the above, even when higher definition and frame narrowing are progressed and the arrangement interval between the first lead-out portion 27Bα and the second lead-out portion 27Bβ is narrowed, the unevenness in the film thickness is unlikely to occur in the first alignment film 29.

As shown in FIGS. 8 and 9, the plurality of the common wirings 40 are disposed so that the first common wirings 40α and the second common wirings 40β are alternately disposed one by one. The plurality of the dummy wirings 41 are disposed so that the first dummy wirings 41α and the second dummy wirings 41β are alternately disposed one by one. In this manner, as compared with the case where a plurality of the first common wirings and the first dummy wirings, and a plurality of the second common wirings and the second dummy wirings are alternately disposed side by side, the flatness of the second insulating film 35 is increased. As a result, when the first alignment film 29 is formed on the upper layer side than the second insulating film 35, the flow of the material of the first alignment film 29 spreading from the display region AA to the non-display region NAA is unlikely to be hindered due to the unevenness that may occur on the surface of the second insulating film 35. Therefore, the unevenness in the film thickness is unlikely to occur in the first alignment film 29.

As shown in FIGS. 8 and 9, between the first common wiring 40α and the second common wiring 40β that are adjacent to each other, an interval D2 is provided that is equal to an interval D1 between the first lead-out portion 27Bα and the second lead-out portion 27Bβ that are adjacent to each other. Between the first dummy wiring 41α and the second dummy wiring 41β adjacent to each other, the same interval D2 is provided as that between the first common wiring 40α and the second common wiring 40β adjacent to each other. In this manner, of the second insulating film 35 outside the display region AA, each portion overlapping with the first common wiring 40α and the first dummy wiring 41α, and the second common wiring 40β and the second dummy wiring 41β has the same degree of flatness as the portion overlapping with the first lead-out portion 27Bα and the second lead-out portion 27Bβ. As a result, when the first alignment film 29 is formed on the upper layer side than the second insulating film 35, the flow of the material of the first alignment film 29 spreading from the display region AA to the non-display region NAA is unlikely to be hindered due to the unevenness that may occur on the surface of the second insulating film 35. Each wire width of the first common wiring 40α and the second common wiring 40β is larger than each wire width of the first lead-out portion 27Bα and the second lead-out portion 27Bβ.

Similarly, each wire width of the first dummy wiring 41α and the second dummy wiring 41β is larger than each wire width of the first lead-out portion 27Bα and the second lead-out portion 27Bβ.

As described above, the liquid crystal panel (display device) 11 of the present embodiment is provided with the first pixel electrode 25α disposed in the display region AA, the first TFT (first switching element) 24α disposed in the display region AA and connected to the first pixel electrode 25α, the first source wiring (first wiring) 27α disposed both inside and outside the display region AA and connected to the first TFT 24α, the second pixel electrode 25β disposed in the display region AA, the second TFT (second switching element) 24β disposed in the display region AA and connected to the second pixel electrode 25β, the second source wiring (second wiring) 27β disposed both inside and outside the display region AA and connected to the second TFT 24β, the first common wiring 40α and the first dummy wiring 41α, which are the third wirings, disposed outside the display region AA and not connected to the first TFT 24α and the second TFT 24β, the second common wiring 40β and the second dummy wiring 41β, which are the fourth wirings, disposed adjacent to the first common wiring 40α and the first dummy wiring 41α, which are the third wirings, outside the display region AA and not connected to the first TFT 24α and the second TFT 24β, the first insulating film 34, the second insulating film 35 disposed on an upper layer side than the first insulating film 34, and the first alignment film (alignment film) 29 disposed on an upper layer side than the second insulating film 35. The first source wiring 27α includes the first lead-out portion 27Bα disposed outside the display region AA and located on the lower layer side of the first insulating film 34. The second source wiring 27β includes the second lead-out portion 27Bβ disposed adjacent to the first lead-out portion 27Bα outside the display region AA and located on the lower layer side of the second insulating film 35 on the upper layer side of the first insulating film 34. The first common wiring 40α and the first dummy wiring 41α, which are the third wirings, are located on the lower layer side of the first insulating film 34. The second common wiring 40β and the second dummy wiring 41β, which are the fourth wirings, are located on the lower layer side of the second insulating film 35 on the upper layer side of the first insulating film 34.

When the first TFT 24α and the second TFT 24β are driven, each signal supplied to the first source wiring 27α and the second source wiring 27β is supplied to the first pixel electrode 25α and the second pixel electrode 25β, respectively. The first pixel electrode 25α and the second pixel electrode 25β are charged to a potential based on each signal supplied to the first source wiring 27α and the second source wiring 27β. An image is displayed in the display region AA by the charged first pixel electrode 25α and the second pixel electrode 25β.

The first lead-out portion 27Bα of the first source wiring 27α disposed outside the display region AA is located on the lower layer side of the first insulating film 34. On the other hand, the second lead-out portion 27Bβ of the second source wiring 27β disposed outside the display region AA is disposed adjacent to the first lead-out portion 27Bα and is located on the lower layer side of the second insulating film 35 on the upper layer side of the first insulating film 34. As described above, the first lead-out portion 27Bα and the second lead-out portion 27Bβ adjacent to each other are kept in the insulated state by the first insulating film 34. As a result, the arrangement interval between the first lead-out portion 27Bα and the second lead-out portion 27Bβ can be reduced, and it is suitable for achieving higher definition and frame narrowing.

Meanwhile, the first common wiring 40α and the first dummy wiring 41α, which are the third wirings disposed outside the display region AA, are located on the lower layer side of the first insulating film 34. On the other hand, the second common wiring 40β and the second dummy wiring 41β, which are the fourth wirings, disposed adjacent to the first common wiring 40α and the first dummy wiring 41α, which are the third wirings, outside the display region AA are located on the lower layer side of the second insulating film 35 on the upper layer side of the first insulating film 34. In this manner, as compared with the case where the first common wiring 40α and the first dummy wiring 41α, which are the third wirings, and the second common wiring 40β and the second dummy wiring 41β, which are the fourth wirings, are all located on the lower layer side of the first insulating film 34, the flatness of the portion of the second insulating film 35 that overlaps with the first common wiring 40α and the first dummy wiring 41α, which are the third wirings, and the second common wiring 40β and the second dummy wiring 41β, which are the fourth wirings, is increased. As a result, when the first alignment film 29 is formed on the upper layer side than the second insulating film 35, the flow of the material of the first alignment film 29 spreading from the inside of the display region AA to the outside of the display region AA is unlikely to be hindered due to the unevenness that may occur on the surface of the second insulating film 35. Since the first alignment film 29 formed in this manner is unlikely to have the unevenness in the film thickness, the display quality of the image displayed in the display region AA is improved. According to the above, even when higher definition and frame narrowing are progressed and the arrangement interval between the first lead-out portion 27Bα and the second lead-out portion 27Bβ is narrowed, the unevenness in the film thickness is unlikely to occur in the first alignment film 29.

A plurality of the first lead-out portions 27Bα, a plurality of the second lead-out portions 27Bβ, the plurality of the first common wirings 40α and the plurality of the first dummy wirings 41α, which are the third wirings, and the plurality of the second common wirings 40β and the plurality of the second dummy wirings 41β, which are the fourth wirings, are provided, the first lead-out portions 27Bα and the second lead-out portions 27Bβ are alternately disposed side by side one by one, and the first common wiring 40α and the first dummy wiring 41α, which are the third wirings, and the second common wirings 40β and the second dummy wirings 41β, which are fourth wirings, are alternately disposed side by side one by one. As compared with the case where the plurality of the first lead-out portions and the plurality of the second lead-out portions are alternately disposed side by side, and the plurality of the first common wirings and the plurality of the first dummy wirings, which are the third wirings, and the plurality of the second common wirings and the plurality of the second dummy wirings, which are the fourth wirings, are alternately disposed side by side, the flatness of the second insulating film 35 is increased. As a result, when the first alignment film 29 is formed on the upper layer side than the second insulating film 35, the flow of the material of the first alignment film 29 spreading from the inside of the display region AA to the outside of the display region AA is further unlikely to be hindered due to the unevenness that may occur on the surface of the second insulating film 35.

The first lead-out portion 27Bα and the second lead-out portion 27Bβ are disposed at an interval D1, and the first common wiring 40α and the first dummy wiring 41α, which are the third wirings, and the second common wiring 40β and the second dummy wiring 41β, which are the fourth wirings, are disposed at an interval D2 that is the same as the interval D1 between the first lead-out portion 27Bα and the second lead-out portion 27Bβ. In this manner, of the second insulating film 35 outside the display region AA, each portion overlapping with the first common wiring 40α and the first dummy wiring 41α, which are the third wirings, and the second common wiring 40β and the second dummy wiring 41β, which are the fourth wirings, has the same degree of flatness as the portion overlapping with the first lead-out portion 27Bα and the second lead-out portion 27Bβ. As a result, when the first alignment film 29 is formed on the upper layer side than the second insulating film 35, the flow of the material of the first alignment film 29 spreading from the inside of the display region AA to the outside of the display region AA is further unlikely to be hindered due to the unevenness that may occur on the surface of the second insulating film 35.

The common electrode 28 disposed in the display region AA and overlapping with the first pixel electrode 25α and the second pixel electrode 25β is provided, and the first common wiring 40α, which is the third wiring, and the second common wiring 40β, which is the fourth wiring, are connected to the common electrode 28. The common electrode 28 has a potential based on a signal (common signal) supplied from the first common wiring 40α, which is the third wiring, and the second common wiring 40β, which is the fourth wiring. The image is displayed by using an electric field generated based on the potential difference between the common electrode 28 and the first pixel electrode 25α or an electric field generated based on the potential difference between the common electrode 28 and the second pixel electrode 25β.

The first dummy wiring 41α, which is the third wiring, and the second dummy wiring 41β, which is the fourth wiring, are electrically isolated. The degree of freedom in a disposition of the first dummy wiring 41α, which is the third wiring, and the second dummy wiring 41β, which is the fourth wiring, outside the display region AA is increased.

Therefore, the first dummy wiring 41α, which is the third wiring, and the second dummy wiring 41β, which is the fourth wiring, can be disposed so as to planarly fill a space where the first source wiring 27α and the second source wiring 27β are not disposed outside the display region AA.

The array substrate (first substrate) 21 on which the first pixel electrode 25α, the first TFT 24α, the first source wiring 27α, the second pixel electrode 25β, the second TFT 24β, the second source wiring 27β, the first common wiring 40α and the first dummy wiring 41α, which are the third wirings, the second common wiring 40β and the second dummy wiring 41β, which are the fourth wirings, the first insulating film 34, the second insulating film 35, and the first alignment film 29 are provided, the counter substrate (second substrate) 20 disposed to face the array substrate 21, and the liquid crystal layer 22 interposed between the array substrate 21 and the counter substrate 20 are provided. In addition to the first source wiring 27α and the second source wiring 27β, the first common wiring 40α and the first dummy wiring 41α, which are the third wirings, and the second common wiring 40β and the second dummy wiring 41β, which are the fourth wirings, are disposed outside the display region AA of the array substrate 21, so that the interval between the array substrate 21 and the counter substrate 20 outside the display region AA, that is, the thickness of the liquid crystal layer 22 can be made uniform. As a result, since vacuum bubbles are unlikely to be generated in the liquid crystal layer 22, deterioration of display quality caused by the vacuum bubbles is suppressed.

Embodiment 2

Embodiment 2 will be described with reference to FIG. 10 or 11. Embodiment 2 shows a case where a configuration of the common wiring 140 and the dummy wiring 141 is changed. Duplicate descriptions of structure, action, and effect similar to those of Embodiment 1 described above will be omitted.

Figure 10:
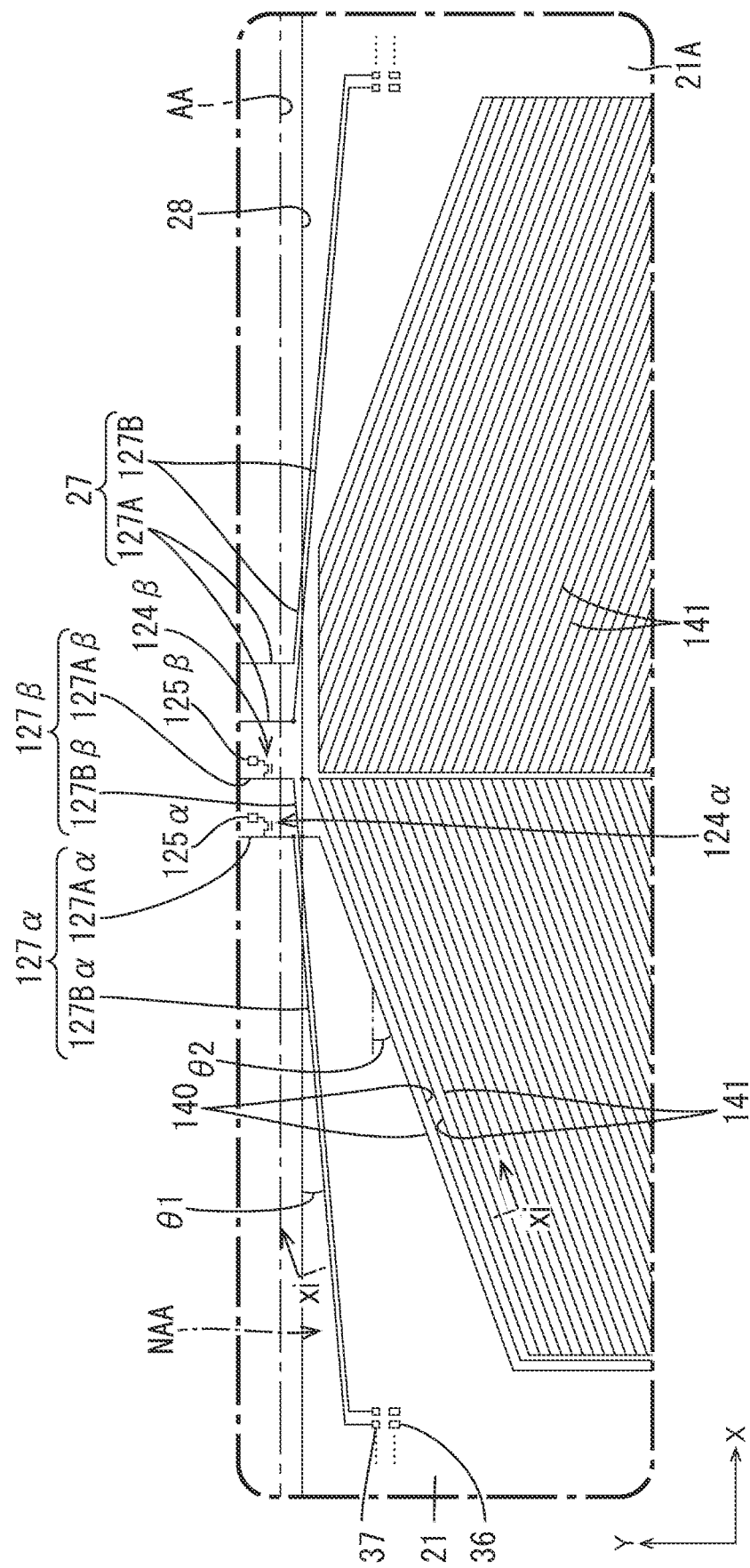
FIG. 10 is an enlarged plan view of the vicinity of a protrusion portion of an array substrate according to Embodiment 2.
Figure 11:
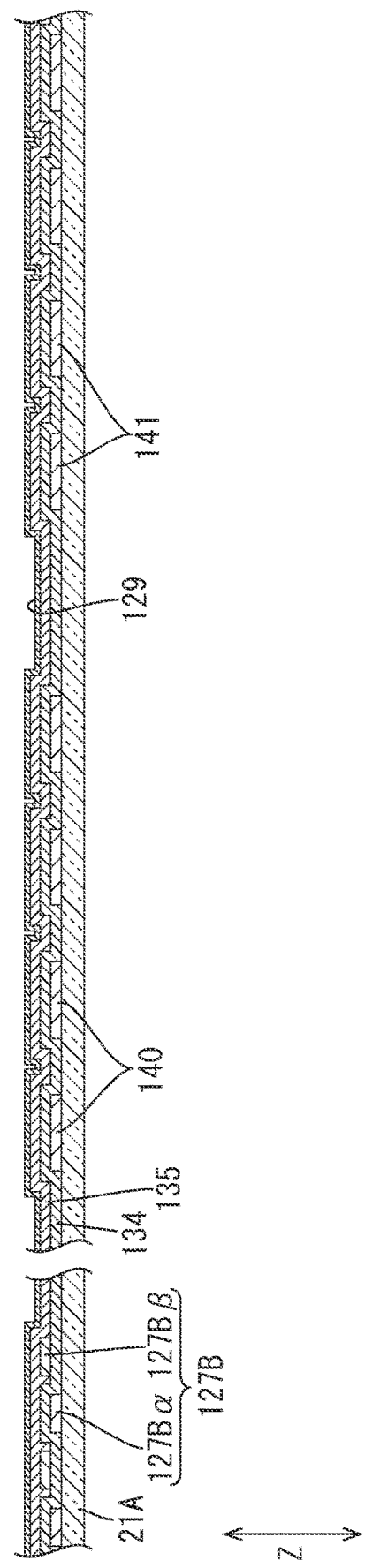
FIG. 11 is a cross-sectional view of the array substrate according to Embodiment 2 taken along the line xi-xi in FIG. 10.

First, as shown in FIG. 10, the lead-out portion 127B according to the present embodiment is inclined at a first angle θ1 with respect to the X-axis direction (second direction) orthogonal to the Y-axis direction which is the extending direction of the wiring main body 127A. The first lead-out portion 127Bα and the second lead-out portion 127Bβ adjacent to each other have the same inclination angle with respect to the X-axis direction, which is the first angle θ1. The first angle θ1 has a range of, for example, 3 degrees to 15 degrees.

On the other hand, as shown in FIG. 10, the common wiring (third wiring) 140 and the dummy wiring (third wiring) 141 are inclined at a second angle θ2 greater than the first angle θ1 with respect to the X-axis direction. The difference between the first angle θ1 and the second angle θ2 is 10 degrees or more. Therefore, the second angle θ2 is at least 13 degrees or more. As shown in FIG. 11, a plurality of the common wirings 140 and a plurality of the dummy wirings 141 are all made of the first metal film. That is, all the common wirings 140 and dummy wirings 141 are disposed on the lower layer side of the first insulating film 134.

As described above, in the present embodiment, since all the common wiring 140 and the dummy wiring 141 are made of the first metal film, in order to avoid pattern defects due to film residue, and the like, it is desired to make the interval between two adjacent common wirings 140 or the interval between two adjacent dummy wirings 141 wider than that in Embodiment 1 (refer to FIG. 9). Therefore, the flatness of the portion of the second insulating film 135 overlapping with the common wiring 140 and the dummy wiring 141 tends to be lower than the flatness of the portion overlapping with the first lead-out portion 127Bα and the second lead-out portion 127Bβ. As a result, when the first alignment film 129 is formed on the upper layer side than the second insulating film 135, there is concern that the flow of the material of the first alignment film 129 spreading from the display region AA to the non-display region NAA may be hindered due to unevenness that occurs on the surface of the portion of the second insulating film 135 overlapping with the common wiring 140 and the dummy wiring 141. In this respect, since the common wiring 140 and the dummy wiring 141, which are a plurality of the third wirings, are inclined at the second angle θ2 greater than the first angle θ1 with respect to the X-axis direction, when the first alignment film 129 is formed, the material of the first alignment film 129 can be likely to flow along the extending direction of the common wiring 140 and the dummy wiring 141. As a result, since the unevenness in the film thickness of the formed first alignment film 129 is unlikely to occur, the display quality of the image displayed in the display region AA is improved.

As described above, the liquid crystal panel 111 according to the present embodiment includes the first pixel electrode 125α disposed in the display region AA, the first TFT 124α disposed in the display region AA and connected to the first pixel electrode 125α, the first source wiring 127α disposed inside and outside the display region AA and connected to the first TFT 124α, the second pixel electrode 125β disposed in the display region AA, the second TFT 124β disposed in the display region AA and connected to the second pixel electrode 125β, the second source wiring 127β disposed inside and outside the display region AA and connected to the second TFT 124β, the common wiring 140 and the dummy wiring 141, which are the plurality of the third wirings, disposed in parallel with each other outside the display region AA and not connected to the first TFT 124α and the second TFT 124β, the first insulating film 134, the second insulating film 135 disposed on the upper layer side than the first insulating film 134, and the first alignment film 129 disposed on the upper layer side than the second insulating film 135. The first source wiring 127α includes the first wiring main body 127Aα disposed in the display region AA and extending along the first direction, and the first lead-out portion 127Bα disposed outside the display region AA and located on the lower layer side of the first insulating film 134. The second source wiring 127β includes the second wiring main body 127Aβ disposed in the display region AA and extending along the first direction, and the second lead-out portion 127Bβ disposed adjacent to the first lead-out portion 127Bα outside the display region AA and located on the lower layer side of the second insulating film 135 on the upper layer side of the first insulating film 134. The first lead-out portion 127Bα and the second lead-out portion 127Bβ are inclined at the first angle θ1 with respect to the second direction orthogonal to the first direction. The common wiring 140 and the dummy wiring 141, which are the plurality of the third wirings, are located on the lower layer side of the first insulating film 134 or on the lower layer side of the second insulating film 135 on the upper layer side of the first insulating film 134, and are inclined at the second angle θ2, which is greater than the first angle θ1, with respect to the second direction.

When the first TFT 124α and the second TFT 124β are driven, each signal supplied to the first source wiring 127α and the second source wiring 127β is supplied to the first pixel electrode 125α and the second pixel electrode 125β, respectively. The first pixel electrode 125α and the second pixel electrode 125β are charged to a potential based on each signal supplied to the first source wiring 127α and the second source wiring 127β. An image is displayed in the display region AA by the charged first pixel electrode 125α and the second pixel electrode 125β.

The first lead-out portion 127Bα of the first source wiring 127α disposed outside the display region AA is located on the lower layer side of the first insulating film 134. On the other hand, the second lead-out portion 127Bβ of the second source wiring 127β disposed outside the display region AA is disposed adjacent to the first lead-out portion 127Bα and is located on the lower layer side of the second insulating film 135 on the upper layer side of the first insulating film 134. As described above, the first lead-out portion 127Bα and the second lead-out portion 127Bβ adjacent to each other are kept in an insulated state by the first insulating film 134. As a result, the arrangement interval between the first lead-out portion 127Bα and the second lead-out portion 127Bβ can be reduced, and it is suitable for achieving higher definition and frame narrowing.

On the other hand, the common wiring 140 and the dummy wiring 141, which are the plurality of the third wirings disposed in parallel with each other outside the display region AA, are located on the lower layer side of the first insulating film 134 or on the lower layer side of the second insulating film 135 on the upper layer side of the first insulating film 134. In such a configuration, the flatness of the portion of the second insulating film 135 overlapping with the common wiring 140 and the dummy wiring 141, which are the plurality of the third wirings, tends to be lower than the flatness of the portion overlapping with the first lead-out portion 127Bα and the second lead-out portion 127Bβ. Therefore, when the first alignment film 129 is formed on the upper layer side than the second insulating film 135, there is concern that the flow of the material of the first alignment film 129 spreading from the inside of the display region AA to the outside of the display region AA may be hindered due to unevenness that occurs on the surface of the portion of the second insulating film 135 overlapping with the common wiring 140 and the dummy wiring 141, which are the plurality of the third wirings. In this respect, since the common wiring 140 and the dummy wiring 141, which are the plurality of the third wirings, are inclined at the second angle θ2 greater than the first angle θ1 with respect to the second direction, when the first alignment film 129 is formed, the material of the first alignment film 129 can be likely to flow along the extending direction of the common wiring 140 and the dummy wiring 141, which are the plurality of the third wirings. As a result, since the unevenness in the film thickness of the formed first alignment film 129 is unlikely to occur, the display quality of the image displayed in the display region AA is improved. According to the above, even when higher definition and frame narrowing are progressed and the arrangement interval between the first lead-out portion 127Bα and the second lead-out portion 127Bβ is narrowed, the unevenness in the film thickness is unlikely to occur in the first alignment film 129.

Embodiment 3

Embodiment 3 will be described with reference to FIG. 12 or 13. Embodiment 3 shows a case where a planar configuration of the common wiring 240 and the dummy wiring 241 is changed from that of Embodiment 1 described above. Duplicate descriptions of structure, action, and effect similar to those of Embodiment 1 described above will be omitted.

Figure 12:
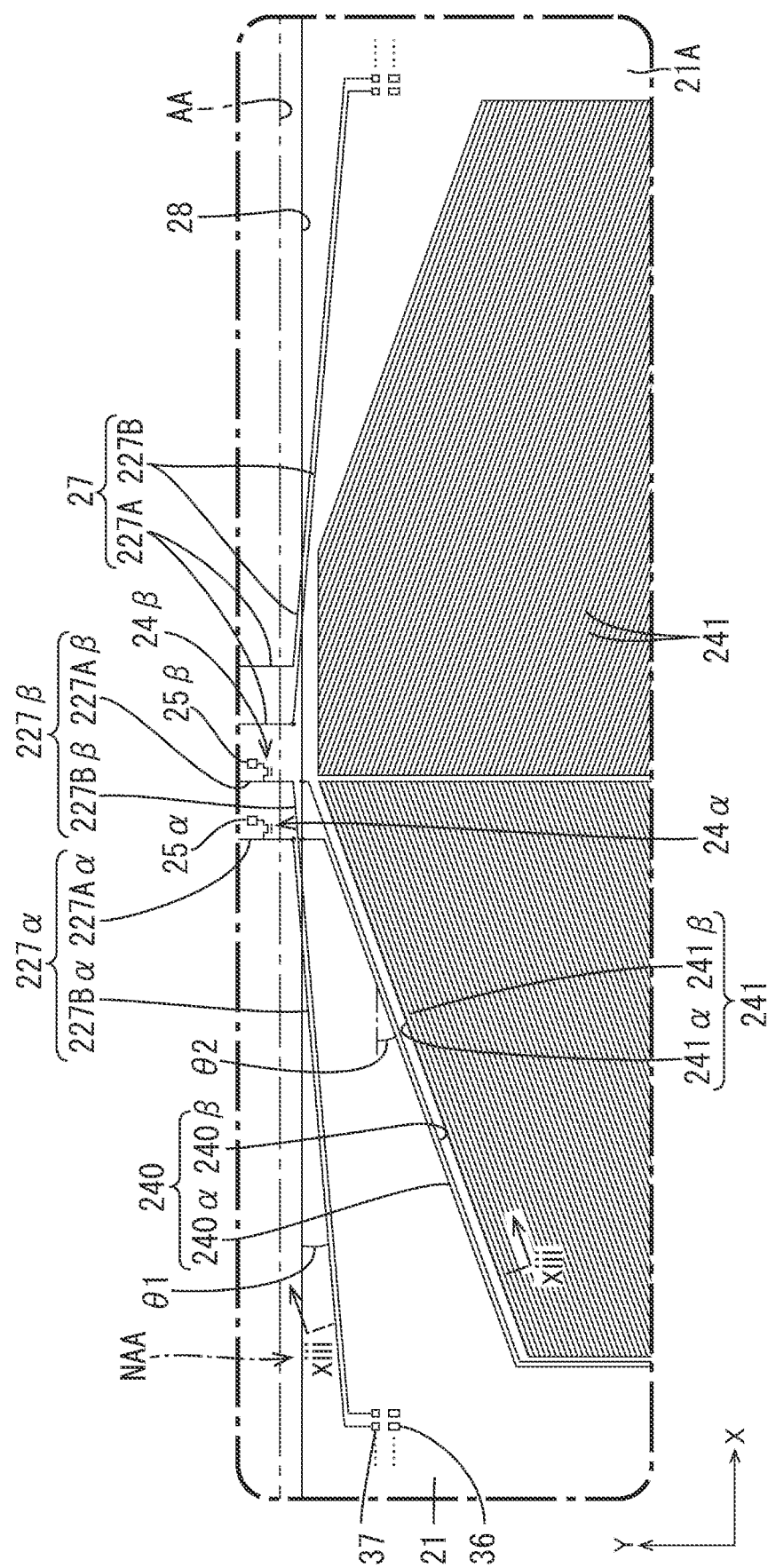
FIG. 12 is an enlarged plan view of the vicinity of a protrusion portion of an array substrate according to Embodiment 3.
Figure 13:
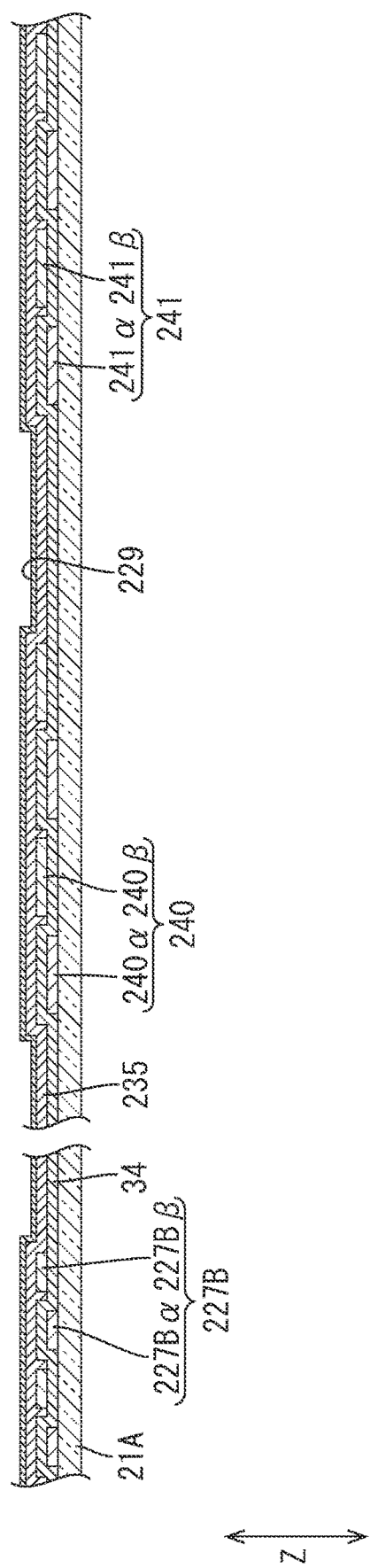
FIG. 13 is a cross-sectional view of the array substrate according to Embodiment 3 taken along the line xiii-xiii in FIG. 12.

First, as shown in FIG. 12, the lead-out portion 227B according to the present embodiment is inclined at a first angle θ1 with respect to the X-axis direction (second direction) orthogonal to the Y-axis direction which is the extending direction of the wiring main body 227A. The first lead-out portion 227Bα and the second lead-out portion 227Bβ adjacent to each other have the same inclination angle with respect to the X-axis direction, which is the first angle θ1. The first angle θ1 has a range of, for example, 3 degrees to 15 degrees.

On the other hand, as shown in FIG. 12, the common wiring 240 and the dummy wiring 241 are inclined at a second angle θ2 greater than the first angle θ1 with respect to the X-axis direction. The difference between the first angle θ1 and the second angle θ2 is 10 degrees or more. Therefore, the second angle θ2 is at least 13 degrees or more. As shown in FIG. 13, a plurality of the common wirings 240 and a plurality of the dummy wirings 241 include a first common wiring 240α and a first dummy wiring 241α made of a first metal film, and a second common wiring 240β and a second dummy wiring 241β made of a second metal film. As shown in FIG. 12, each of the first common wiring 240α and the first dummy wiring 241α, and the second common wiring 240β and the second dummy wiring 241β is inclined at the second angle θ2 with respect to the X-axis direction.

According to such a configuration, when the first alignment film 229 is formed on the upper layer side than the second insulating film 235, the material of the first alignment film 229 spreading from the display region AA to the non-display region NAA can be likely to flow along the extending direction of the first common wiring 240α and the first dummy wiring 241α, and the second common wiring 240β and the second dummy wiring 241β inclined at the second angle θ2 greater than the first angle θ1 with respect to the X-axis direction. As a result, since the unevenness in the film thickness of the formed first alignment film 229 is unlikely to occur, the display quality of the image displayed in the display region AA is further improved.

As described above, according to the present embodiment, the first source wiring 227α includes the first wiring main body 227Aα disposed in the display region AA and extending along the first direction, the second source wiring 227β includes the second wiring main body 227Aβ disposed in the display region AA and extending along the first direction, each of the first lead-out portion 227Bα and the second lead-out portion 227Bβ is inclined at the first angle θ1 with respect to the second direction orthogonal to the first direction, and each of the first common wiring 240α and the first dummy wiring 241α, which are the third wirings, and each of the second common wiring 240β and the second dummy wiring 241β, which are the fourth wirings, is inclined at the second angle θ2 greater than the first angle θ1 with respect to the second direction. When the first alignment film 229 is formed on the upper layer side than the second insulating film 235, the material of the first alignment film 229 spreading from the inside of the display region AA to the outside of the display region AA can be likely to flow along the extending direction of the first common wiring 240α and the first dummy wiring 241α, which are the third wirings, and the second common wiring 240β and the second dummy wiring 241β, which are the fourth wirings inclined at the second angle θ2 greater than the first angle θ1 with respect to the second direction. As a result, since the unevenness in the film thickness of the formed first alignment film 229 is unlikely to occur, the display quality of the image displayed in the display region AA is further improved.

Other Embodiments

The technique disclosed in the present specification is not limited to the embodiments described by the above description and drawings, and for example, the following embodiments are also included in the technical scope.

(1) A plurality of the first lead-out portions 27Bα, 127Bα, and 227Bα and a plurality of the second lead-out portions 27Bβ, 127Bβ, and 227Bβ may be alternately disposed side by side.

(2) In the configurations described in Embodiments 1 and 3, a plurality of the first common wirings 40α and 240α and a plurality of the second common wirings 40β and 240β may be alternately disposed side by side. A plurality of the first dummy wirings 41α and 241α and a plurality of the second dummy wirings 41β and 241β may be alternately disposed side by side.

(3) In the configurations described in Embodiments 1 and 3, the intervals between the first common wirings 40α and 240α and the second common wirings 40β and 240β may be different from the intervals between the first lead-out portions 27Bα and 227Bα and the second lead-out portions 27Bβ and 227Bβ.

(4) In the configurations described in Embodiments 1 and 3, the intervals between the first dummy wirings 41α and 241α and the second dummy wirings 41β and 241β may be different from the intervals between the first lead-out portions 27Bα and 227Bα and the second lead-out portions 27Bβ and 227Bβ.

(5) In the configurations described in Embodiments 1 and 3, the intervals between the first common wirings 40α and 240α and the second common wirings 40β and 240β may be different from the intervals between the first dummy wirings 41α and 241α and the second dummy wirings 41β and 241β.

(6) In the configurations described in Embodiments 1 and 3, each wire width of the first common wirings 40α and 240α and the second common wirings 40β and 240β may be the same as each wire width of the first lead-out portions 27Bα and 227Bα and the second lead-out portions 27Bβ and 227Bβ.

(7) In the configuration described in Embodiment 2, any of the plurality of the common wirings 140 and the plurality of the dummy wirings 141 may be made of the second metal film. That is, all the common wiring 140 and the dummy wiring 141 may be disposed on the lower layer side of the second insulating film 135 on the upper layer side of the first insulating film 134.

(8) The array substrate 21 may be provided with a source shared driving (SSD) circuit. The SSD circuit is disposed in the non-display region NAA and is connected to the wiring main bodies 27A, 127A, and 227A and the lead-out portions 27B, 127B, and 227B in the source wiring 27. The SSD circuit has a switch function and the like of distributing the image signals supplied from the driver 12 through the lead-out portions 27B, 127B, and 227B to the plurality of the wiring main bodies 27A, 127A, and 227A. In this case, the plurality of the wiring main bodies 27A, 127A, and 227A and the one lead-out portions 27B, 127B, and 227B constitute the source wiring.

(9) The specific planar configuration (routing pattern viewed in a plane) of the plurality of the lead-out portions 27B, 127B, and 227B, the plurality of the common wirings 40, 140, and 240, and the plurality of the dummy wirings 41, 141, and 241 can be modified as appropriate other than that shown in the drawings.

(10) Either one of the common wirings 40, 140, and 240 and the dummy wirings 41, 141, and 241 may not be disposed in the long side portion including the protrusion portion 21A in the non-display region NAA of the array substrate 21.

(11) The number of installed drivers 12 may be one or three or more. In a case where the number of installed drivers 12 is one, the common wirings 40, 140, and 240 or the dummy wirings 41, 141, and 241 are disposed in portions adjacent to one side or both sides of the lead-out portions 27B, 127B, and 227B of the source wiring 27 in the X-axis direction.

(12) In a case where the common potential signal is supplied to the array substrate 21 by the driver 12, the other end portion of the common wiring 40 may be connected to the output terminal 37 to which the common potential signal is supplied by the driver 12 of the plurality of the output terminals 37.

(13) The plurality of the output terminals 37 disposed in the mounting region of the driver 12 may be arranged in a zigzag shape, for example.

(14) Each of the alignment films 29, 33, 129, and 229 may be subjected to an alignment treatment by rubbing.

(15) The materials of the counter substrate 20 and the array substrate 21 may be synthetic resin or the like, in addition to glass.

(16) The display mode of the liquid crystal panels 11 and 111 may be an in-plane switch (IPS) mode or the like.

(17) The planar shape of the liquid crystal panels 11 and 111 may be a horizontally long and vertically long rectangle, a square, a circle, a semicircle, an oval, an ellipse, a trapezoid, or the like.

The present disclosure contains subject matter related to that disclosed in Japanese Priority Patent Application JP 2022-196426 filed in the Japan Patent Office on Dec. 8, 2022, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a first pixel electrode disposed in a display region;
a first switching element disposed in the display region and connected to the first pixel electrode;
a first wiring disposed inside and outside the display region and connected to the first switching element;
a second pixel electrode disposed in the display region;
a second switching element disposed in the display region and connected to the second pixel electrode;
a second wiring disposed inside and outside the display region and connected to the second switching element;
a third wiring disposed outside the display region and not connected to the first switching element and the second switching element;
a fourth wiring disposed adjacent to the third wiring outside the display region and not connected to the first switching element and the second switching element;
a first insulating film;
a second insulating film disposed on an upper layer side than the first insulating film; and
an alignment film disposed on an upper layer side than the second insulating film, wherein
the first wiring includes a first lead-out portion disposed outside the display region and located on a lower layer side of the first insulating film,
the second wiring includes a second lead-out portion disposed adjacent to the first lead-out portion outside the display region and located on a lower layer side of the second insulating film on the upper layer side of the first insulating film,
the third wiring is located on the lower layer side of the first insulating film, and
the fourth wiring is located on the lower layer side of the second insulating film on the upper layer side of the first insulating film.

2. The display device according to claim 1, wherein
a plurality of the first lead-out portions, a plurality of the second lead-out portions, a plurality of the third wirings, and a plurality of the fourth wirings are provided, and
the first lead-out portions and the second lead-out portions are alternately disposed side by side one by one, and the third wirings and the fourth wirings are alternately disposed side by side one by one.

3. The display device according to claim 1, wherein
the first lead-out portion and the second lead-out portion are disposed at an interval, and the third wiring and the fourth wiring are disposed at an interval that is the same as the interval between the first lead-out portion and the second lead-out portion.

4. The display device according to claim 1, further comprising:
a common electrode disposed in the display region and overlapping with the first pixel electrode and the second pixel electrode, wherein the third wiring and the fourth wiring are connected to the common electrode.

5. The display device according to claim 1, wherein
the third wiring and the fourth wiring are electrically isolated.

6. The display device according to claim 1, further comprising:
a first substrate on which the first pixel electrode, the first switching element, the first wiring, the second pixel electrode, the second switching element, the second wiring, the third wiring, the fourth wiring, the first insulating film, the second insulating film, and the alignment film are provided;
a second substrate disposed to face the first substrate; and
a liquid crystal layer interposed between the first substrate and the second substrate.

7. The display device according to claim 1, wherein
the first wiring includes a first wiring main body disposed in the display region and extending along a first direction,
the second wiring includes a second wiring main body disposed in the display region and extending along the first direction,
each of the first lead-out portion and the second lead-out portion is inclined at a first angle with respect to a second direction orthogonal to the first direction, and
each of the third wiring and the fourth wiring is inclined at a second angle greater than the first angle with respect to the second direction.

8. A display device comprising:
a first pixel electrode disposed in a display region;
a first switching element disposed in the display region and connected to the first pixel electrode;
a first wiring disposed inside and outside the display region and connected to the first switching element;
a second pixel electrode disposed in the display region;
a second switching element that is disposed in the display region and is connected to the second pixel electrode;
a second wiring disposed inside and outside the display region and connected to the second switching element;
a plurality of third wirings disposed in parallel with each other outside the display region and not connected to the first switching element and the second switching element;
a first insulating film;
a second insulating film disposed on an upper layer side than the first insulating film; and
an alignment film disposed on an upper layer side than the second insulating film, wherein
the first wiring includes a first wiring main body disposed in the display region and extending along a first direction, and a first lead-out portion disposed outside the display region and located on a lower layer side of the first insulating film,
the second wiring includes a second wiring main body disposed in the display region and extending along the first direction, and a second lead-out portion disposed adjacent to the first lead-out portion outside the display region and located on a lower layer side of the second insulating film on the upper layer side of the first insulating film,
the first lead-out portion and the second lead-out portion are inclined at a first angle with respect to a second direction orthogonal to the first direction, and
the plurality of third wirings are located on the lower layer side of the first insulating film or on the lower layer side of the second insulating film on the upper layer side of the first insulating film, and inclined at a second angle greater than the first angle with respect to the second direction.

\* \* \* \* \*